(12) United States Patent
Kang et al.

(10) Patent No.: US 6,363,004 B1
(45) Date of Patent: *Mar. 26, 2002

(54) NONVOLATILE FERROELECTRIC MEMORY HAVING SHUNT LINES

(75) Inventors: Hee Bok Kang, Daejeon-si; Jin Gu Kim, Chungcheongbuk-do, both of (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/697,502

(22) Filed: Oct. 27, 2000

(30) Foreign Application Priority Data

Nov. 11, 1999 (KR) ........................ 1999-49972

(51) Int. Cl.$^7$ ............................... G11C 11/22
(52) U.S. Cl. ..................... 365/145; 365/149; 365/65
(58) Field of Search ...................... 365/65, 145, 149

(56) References Cited

U.S. PATENT DOCUMENTS

| | | | |
|---|---|---|---|
| 4,873,664 A | 10/1989 | Eaton, Jr. ................. | 364/145 |
| 5,680,344 A | 10/1997 | Seyyedy ................... | 365/145 |
| 5,737,260 A * | 4/1998 | Takata et al. ............ | 365/145 |
| 6,072,711 A * | 6/2000 | Kang ........................ | 365/65 |

* cited by examiner

Primary Examiner—David Nelms
Assistant Examiner—Gene N. Auduong
(74) Attorney, Agent, or Firm—Fleshner & Kim, LLP

(57) ABSTRACT

A nonvolatile ferroelectric memory and method for fabricating the same include shunt lines to reduce RC delay on wordlines in the memory. A unit cell of the nonvolatile ferroelectric memory can include first and second bitlines, first and second transistors, first and second ferroelectric capacitors, a first split wordline formed in a direction to cross the first and second bitlines and coupled to a gate of the first transistor and a first electrode of the second ferroelectric capacitor, and a second split wordline formed in a direction to cross the first and second bitlines and coupled to a gate of the second transistor and a first electrode of the first ferroelectric capacitor. First shunt lines in a plurality of separation layers are over the first split wordlines and are coupled to the first split wordlines. Second shunt lines of the plurality of separation layers are over the second split wordline and are coupled to the second split wordline. The shunt lines reduce a RC delay on the split wordlines to provide a faster operating memory device that can have a reduced device size.

18 Claims, 30 Drawing Sheets

NONVOLATILE FERROELECTRIC MEMORY HAVING SHUNT LINES

BACKGROUND OF THE INVENTION

1. Field of the Invention

The present invention relates to a semiconductor device, and more particularly, to a nonvolatile ferroelectric memory and a method for fabricating the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. As the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

With reference to FIG. 3b, the reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited on an "f" state as shown by hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

A related art nonvolatile ferroelectric memory and a method for fabricating the nonvolatile ferroelectric memory will now be described. FIG. 4a is a diagram that illustrates a layout of a related art nonvolatile ferroelectric memory.

Referring to FIG. 4a, the related art nonvolatile ferroelectric memory is provided with a first active region 41 and a second active region 41a asymmetrically formed at fixed intervals. A first wordline W/L1 is formed to cross the first active region 41, and a second wordline W/L2 is formed to cross the second active region 41a spaced a distance from the first wordline W/L1. A first bitline B/L1 is formed in a direction to cross the first and second wordlines at one side of the first active region 41, and a second bitline B/L2 is formed parallel to the first bitline B/L1 to cross the first and second wordlines at one side of the second active region 41a. A first ferroelectric capacitor FC1 is formed over the first wordline W/L1 and the second wordline W/L2 and is connected to the first active region 41. A second ferroelectric capacitor FC2 is formed over the first wordline W/L1 and is electrically connected to the second active region 41a. A first plate P/L1 is formed over the first wordline W/L1 and is electrically connected to the first ferroelectric capacitor FC1, and a second plate line P/L2 is formed over the second wordline W/L2 and is electrically connected to the second ferroelectric capacitor FC2. FIG. 4a is a diagram that illustrates a layout of a unit cell, wherein the related art nonvolatile ferroelectric memory has the first and second ferroelectric capacitors FC1 and FC2 formed extending along a bitline direction, and the first plateline P/L1 formed over the first wordline W/L1 and the second plateline P/L2 formed over the second wordline W/L2.

FIG. 4b is a diagram that illustrates a cross-section across line I-I' in FIG. 4a. Referring to FIG. 4b, the related art nonvolatile ferroelectric memory is provided with a substrate 51 having an active region and a field region defined thereon, a first wordline 54 and a second wordline 54a formed over the active region and the field region with a first insulating layer 53 disposed inbetween, the first source/drain impurity regions 55 and 56 formed on both sides of the first wordline 54. Second source/drain impurity regions (not shown) are formed on both sides of the second wordline 54a. A second insulating layer 57 is formed on an entire surface inclusive of the first and second wordlines 54 and 54a having a contact hole exposing the first drain impurity region 56, and a first plug layer 58a is stuffed in the contact hole. A first metal layer 59 connects the first plug layer 58a and the first bitline (not shown). A third insulating layer 60 is formed on an entire surface inclusive of the first metal layer 59 having a contact hole exposing the first source impurity region 55, and a second plug layer 62 is stuffed in the contact hole. A barrier metal layer 63 is electrically connected to the second plug layer 62 and extended horizontally over the first wordline to the second wordline 54a. A lower electrode 64 of the first ferroelectric capacitor FC1 is formed on the barrier metal layer 63, a ferroelectric film 65 and an upper electrode 66 of the first ferroelectric capacitor are stacked on the lower electrode 64 of the first ferroelectric capacitor FC1 in succession. A fourth insulating layer 67 is formed on an entire surface inclusive of the upper electrode 66 of the second ferroelectric capacitor. A first plate line 68 is formed over the first wordline 54 and electrically connected to the upper electrode 66 of the first ferroelectric capacitor FC1 through the fourth insulating layer, and a second plate line 68a formed over the second wordline 54a spaced from the first plate line 68.

A method for fabricating the related art nonvolatile ferroelectric memory of FIGS. 4a–4b will now be described. FIGS. 5a~5f are diagrams that illustrate cross-sections showing the steps of a method for fabricating the related art nonvolatile ferroelectric memory shown alone line I-I' in FIG. 4a. As shown in FIG. 5a, a portion of a semiconductor substrate 51 is etched to form a trench, and an insulating film is stuffed in the trench to form a device isolation device 52. A first insulating layer 53 is formed on the substrate in the active region inclusive of the device isolation layer 52. A wordline material layer is formed on the first insulating layer 53, and patterned to form first and second wordlines 54 and 54a at fixed intervals.

As shown in FIG. 5b, the wordlines 54 and 54a are used as masks in implanting impurity ions to form a source impurity region 55 and a drain impurity region 56 having a conduction type opposite to the substrate 51. The source/drain impurity regions 55 and 56 are source/drain impurity regions of the first transistor T1 that takes the first wordline 54 as a gate electrode. Then, a second insulating layer 57 is formed on an entire surface of the substrate 51 inclusive of the first and second wordlines 54 and 54a. A photoresist layer (not shown) is coated on the second insulating layer 55 and patterned, and the patterned photoresist layer is used as a mask in selectively etching the second insulating layer 57 to form a contact hole 58 exposing the drain impurity region 56.

As shown in FIG. 5c, a conductive material is stuffed in the contact hole to form a first plug layer 58a, and first metal layer 59 is formed to connect the first plug layer 58a and the first bitline B/L1. Though not shown, the second bitline B/L2 is electrically connected to the drain impurity region of the second transistor T2.

As shown in FIG. 5d, a third insulating layer 60 is formed on an entire surface inclusive of the fist metal layer 59. A photoresist layer (not shown) is coated on the third insulating layer 60, patterned and used as mask in selectively etching the third insulating layer to form a contact hole 61 exposing the source impurity region 55.

As shown in FIG. 5e, a conductive material is stuffed in the contact hole 61 to form a second plug layer 62 electrically connected to the source impurity region 55. A barrier metal layer 63 is formed to be electrically connected to the second plug layer 62 and a lower electrode 64 of the first ferroelectric capacitor FC1. The lower electrode 64, a ferroelectric film 65 and upper electrode 66 of the first ferroelectric capacitor are successively formed on the barrier metal layer 63.

As shown in FIG. 5f, a fourth insulating layer 67 is formed on the upper electrode 66 of the first ferroelectric capacitor and selectively etched by photolithography to form a contact hole exposing a portion of the upper electrode 66 of the first ferroelectric capacitor FC1. Upon formation of a first plate line 68 connected with the upper electrode 66 of the first ferroelectric capacitor through the contact hole, the related art process for fabricating nonvolatile ferroelectric memory is completed. A second pulse line 68a is also shown in FIG. 5f.

As described above, the related art nonvolatile ferroelectric memory and the related art method for fabricating the same have various disadvantages. A requirement to form the lower electrode of a capacitor thicker for increasing a sectional area of the lower electrode for securing capacitance causes a problem in that etching of the lower electrode is difficult because the lower electrode of the capacitor is formed of metal. Accordingly, there is a limitation in securing the capacitance coming from the limit of forming a thicker lower electrode of the capacitor. Further, the fabrication process is very difficult because the plate line should be formed in a small space so that a sufficient space is secured distinguishing the plate line from a wordline in an adjacent cell as the wordline and the plate line are formed in every unit cell. In addition, an increase of RC delay of the wordlines is not favorable in embodying a fast nonvolatile ferroelectric memory by decreasing an operational speed.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a nonvolatile ferroelectric memory and a method for fabricating the same that substantially obviates one or more of the problems caused by limitations and disadvantages of the related art.

Another object of the present invention is to provide a nonvolatile ferroelectric memory and a method for fabricating the same that reduces a RC delay of a wordline.

Another object of the present invention is to provide a nonvolatile ferroelectric memory and a method for fabricating the same that increases an operational speed.

Another object of the present invention is to provide a nonvolatile ferroelectric memory and a method for fabricating the same that reduces a device size.

Another object of the present invention is to provide a nonvolatile ferroelectric memory and a method for fabricating the same that reduces a RC delay of a split wordline for providing a fast device with an increased operational speed and a reduced device size.

To achieve at least these objects and other advantages in whole or in part and in accordance with the purpose of the present invention, as embodied and broadly described, a nonvolatile ferroelectric memory having a unit cell with first and second bitlines, first and second transistors, and first and second ferroelectric capacitors, includes a first split wordline that crosses the first and second bitlines and is coupled to a gate of the first transistor and a first electrode of the second ferroelectric capacitor, a second split wordline that crosses the first and second bitlines and is coupled to a gate of the second transistor and a first electrode of the first ferroelectric capacitor, first shunt lines of a plurality of separated layers over the first split wordline and coupled to the first split wordline, and second shunt lines of a plurality of separated layers over the second split wordline and coupled to the second split wordline.

To further achieve the above objects in a whole or in part, there is provided a method for fabricating a nonvolatile ferroelectric memory that includes (1) forming first and second split wordlines on a semiconductor substrate, (2) forming plural layers of first and second shunt lines over the first and second split wordlines, respectively, (3) forming a first electrode of the second ferroelectric capacitor over the first shunt lines, and forming a first electrode of the first ferroelectric capacitor over the second shunt lines, (4) forming a ferroelectric layer and the second electrode of the first ferroelectric capacitor on the first electrode of the first ferroelectric capacitor in succession, and forming a ferroelectric layer and the second electrode of the second ferroelectric capacitor on the first electrode of the second ferroelectric capacitor in succession, (5) electrically coupling the second electrode of the first ferroelectric capacitor and the active region at one side of the first split wordline, and electrically coupling the second electrode of the second ferroelectric capacitor and the active region at one side of the second split wordline, and (6) electrically coupling the first shunt lines and the first electrode of the second ferroelectric capacitor to the first split wordline, and electrically coupling the second shunt lines and the first electrode of the first ferroelectric capacitor to the second split wordline.

To further achieve the above objects in a whole or in part, there is provided a ferroelectric memory having a plurality of unit cells, wherein each unit cell includes first and second bitlines extending in a first direction, first and second transistors, first and second ferroelectric capacitors, a first split wordline extending in a second direction to cross the first and second bitlines, wherein the first split wordline is coupled to a control electrode of the first transistor and a first electrode of the second ferroelectric capacitor, a second split wordline extending in the second direction to cross the first and second bitlines and coupled to a control electrode of the second transistor and a first electrode of the first ferroelectric capacitor, at least one first shunt line extending in the second direction and coupled to the first split wordline and at least one second shunt line extending in the second direction and coupled to the second split wordline.

To further achieve the above objects in a whole or in part, there is provided a ferroelectric memory that includes a first active region and a second active region defined in a semiconductor substrate, first and second split wordlines that respectively cross the active regions, first shunt lines in first and second insulating layers over the first split wordline, second shunt lines in the first and second insulating layers over the second split wordline, a first electrode of a second ferroelectric capacitor over the first shunt lines, wherein the first electrode of the second ferroelectric capacitor is coupled to the first split wordline and the first shunt lines and a first electrode of a first ferroelectric capacitor over the second shunt lines, wherein the first electrode of the first ferroelectric capacitor is coupled to the second split wordline and the second shunt lines.

To further achieve the above objects in a whole or in part, there is provided a method for fabricating a ferroelectric memory that includes forming first and second split wordlines on a semiconductor substrate, forming at least one layer of first and second shunt lines over the first and second split wordlines, respectively, forming a second ferroelectric capacitor over the at least one first shunt line and a first ferroelectric capacitor over the at least one second shunt line, electrically coupling a second electrode of the first ferroelectric capacitor and a first active region in the substrate at one side of the first split wordline, and electrically coupling a second electrode of the second ferroelectric capacitor and a second active region in the substrate at one side of the second split wordline and electrically coupling the at least one first shunt line and a first electrode of the second ferroelectric capacitor to the first split wordline, and electrically coupling the at least one second shunt line and a first electrode of the first ferroelectric capacitor to the second split wordline.

To further achieve the above objects in a whole or in part, there is provided a method for fabricating a ferroelectric memory that includes defining a first active region and a second active region on a semiconductor substrate, forming first and second split wordlines extending along a first direction to cross the first and second active regions, respectively, defining sources and drains in the active regions on both sides of the first and second split wordlines, respectively, forming first plugs respectively coupled to the drains respectively and forming second plugs respectively coupled to the sources, forming plural layers including first shunt lines over the first split wordlines and second shunt lines over the second split wordline, forming first and second ferroelectric capacitors over the first and second shunt lines, respectively, each being a second electrode over a ferroelectric layer over a first electrode, electrically coupling the second electrodes of the first and second ferroelectric capacitors to corresponding ones of the second plugs and coupling the first shunt lines and the first electrode of the second ferroelectric capacitor to the first split wordline, and coupling the second shunt lines and the first electrode of the first ferroelectric capacitor to the second split wordline.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 4b illustrates a cross-section along line I-I' of the related art nonvolatile ferroelectric memory in FIG. 4a;

FIGS. 11a~11l are diagrams that illustrate layouts of a method for fabricating a nonvolatile-ferroelectric memory in accordance with a preferred embodiment of the present invention.

DETAILED DESCRIPTION OF PREFERRED EMBODIMENTS

Reference will now be made in detail to the preferred embodiments of a semiconductor memory device and methods for fabricating the same according to the present invention, examples of which are illustrated in the accompanying drawings. Preferred embodiments according to the present invention reduce a RC delay of a split wordline in a nonvolatile ferroelectric memory to increase a speed of operations. According to preferred embodiments, a plurality of layers of shunt lines are provided between a gate electrode of a transistor and a lower electrode of a ferroelectric capacitor, and the shunt lines are electrically coupled outside of a cell region for using the shunt lines as one split wordline, which can significantly reduce a sheet resistance of the split wordline. Formation of the shunt lines before formation of the ferroelectric film can prevent degradation of the ferroelectric film. When forming a plurality of layers of shunt lines, each of the shunt lines are planarized after the formation of the shunt lines, which can form shunt lines having reduced widths, to form a small cell capable of increased integration.

Figure 1:
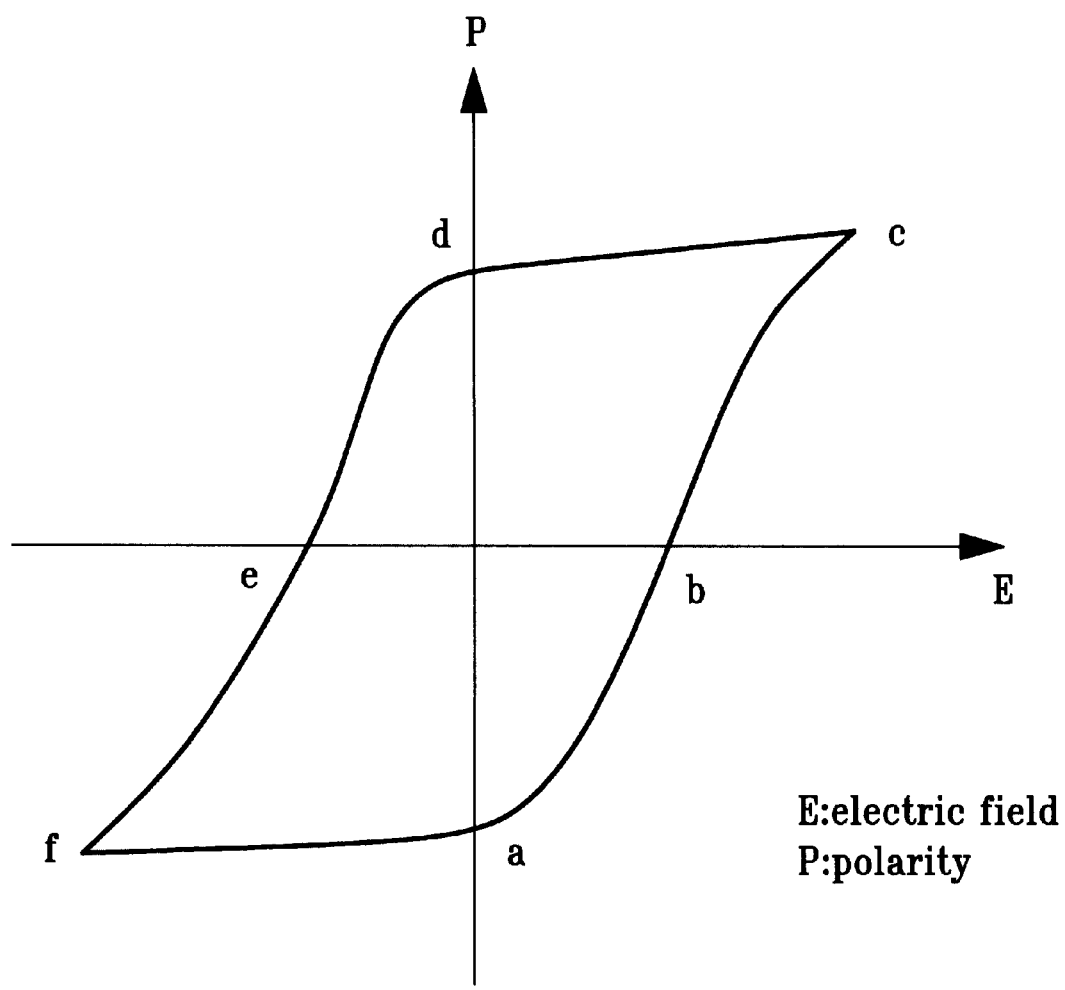
FIG. 1 illustrates a characteristic curve of a hysteresis loop of ferroelectric.
Figure 2:
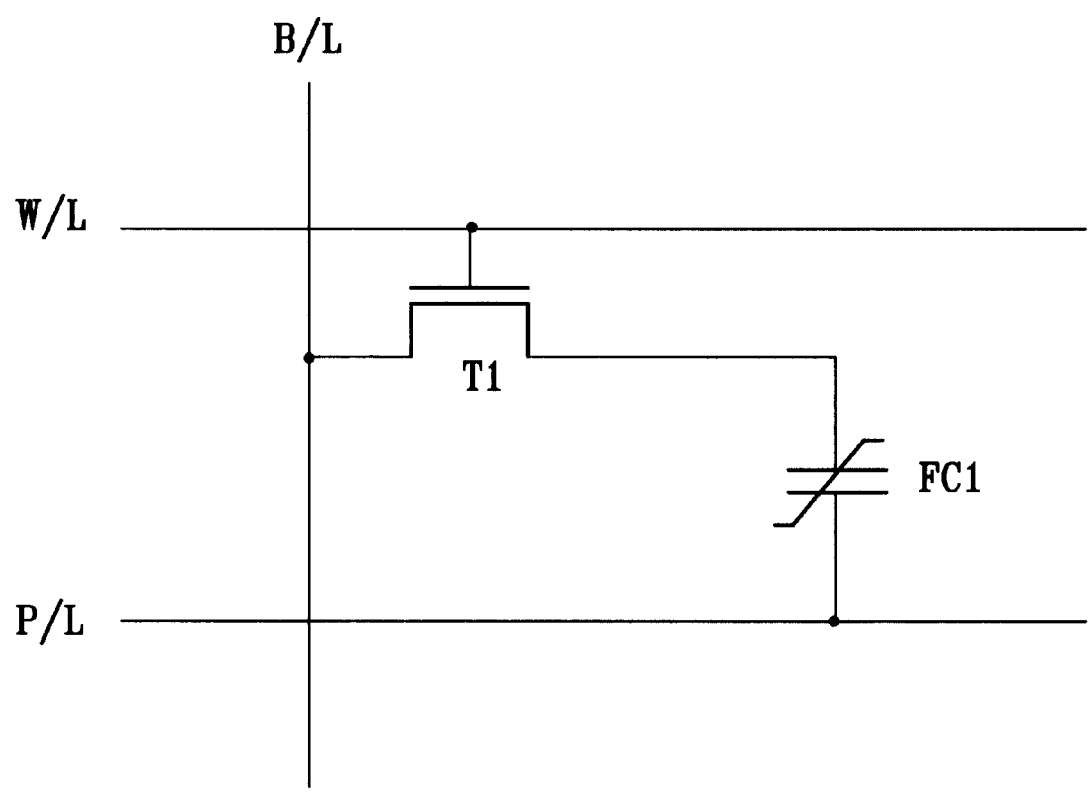
FIG. 2 illustrates a schematic view of a unit cell of a related art non-volatile ferroelectric memory unit cell.
Figure 3A:
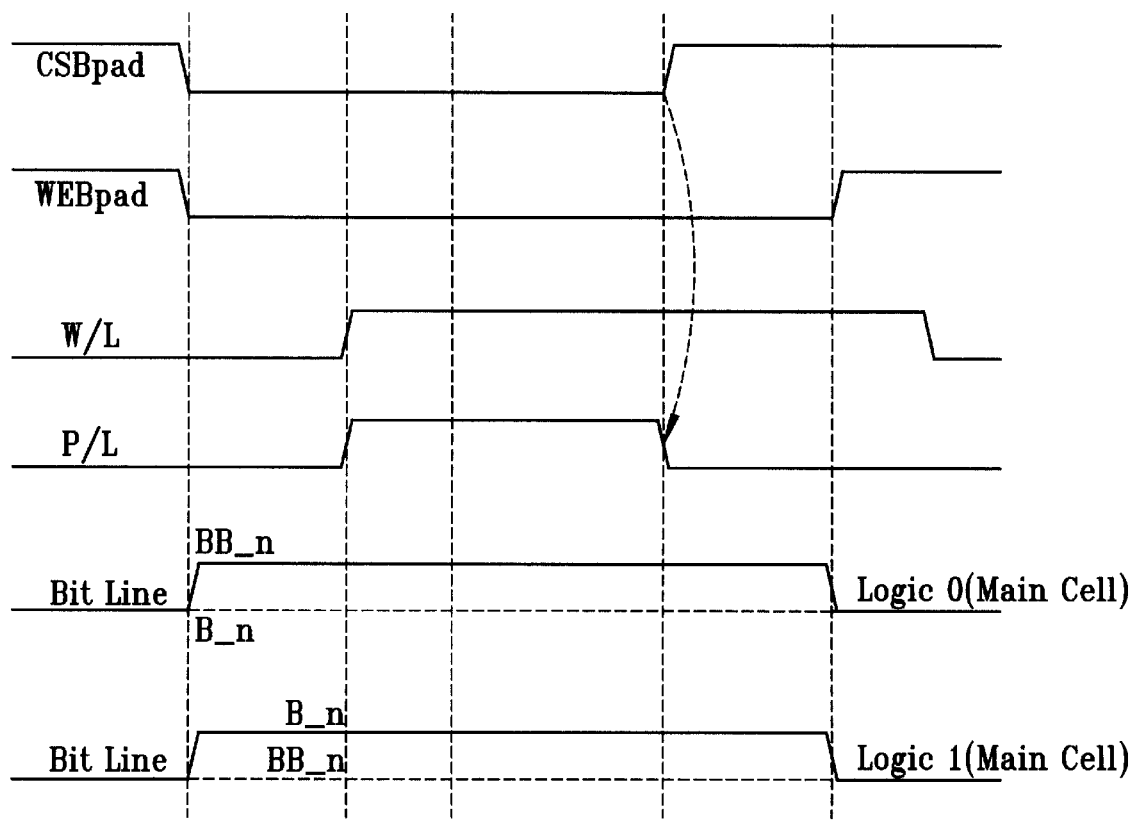
FIG. 3a illustrates a timing diagram of a write mode operation of the related art nonvolatile ferroelectric memory.
Figure 3B:
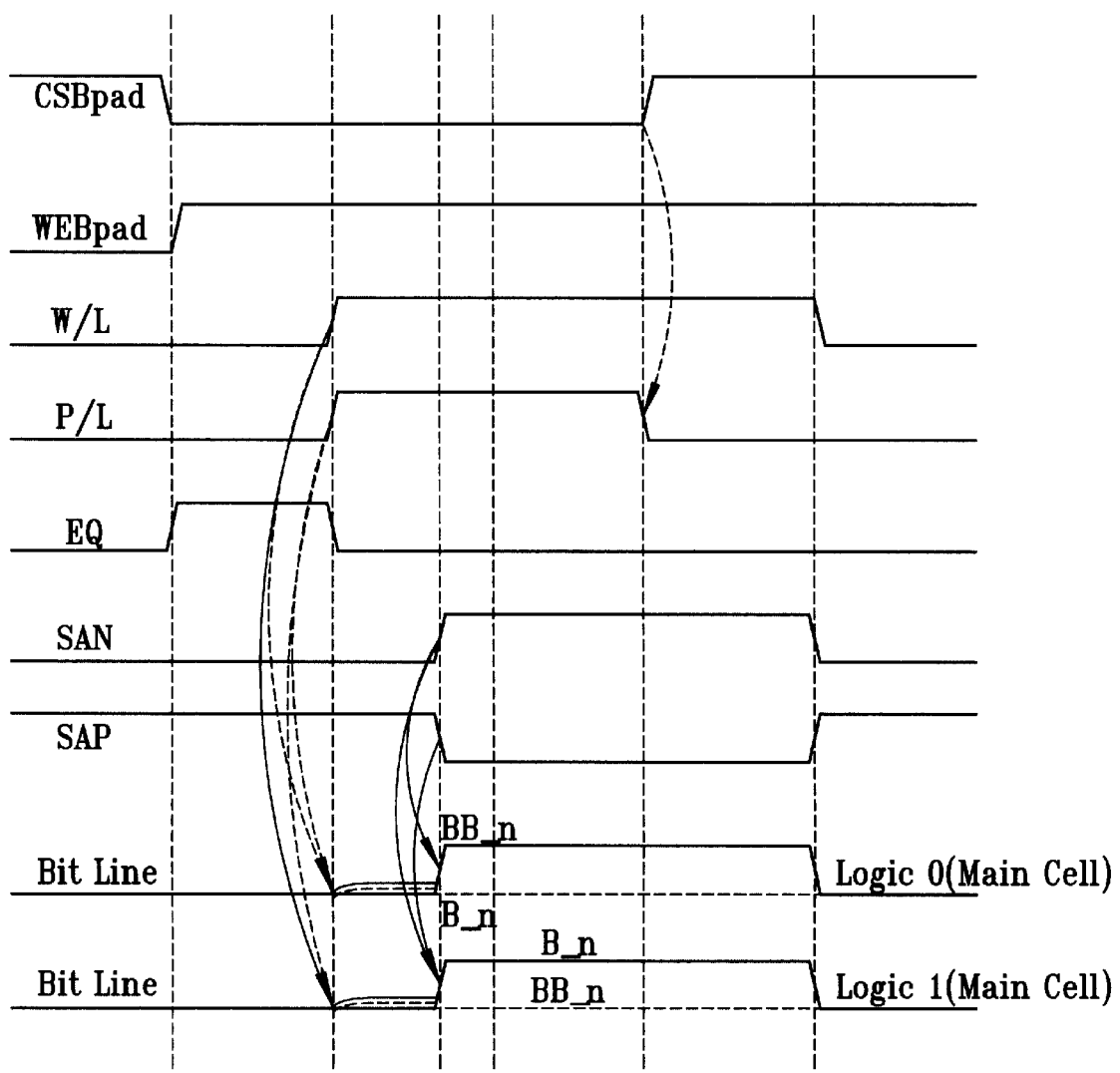
FIG. 3b illustrates a timing diagram of a read mode operation of the related art nonvolatile ferroelectric memory.
Figure 4A:
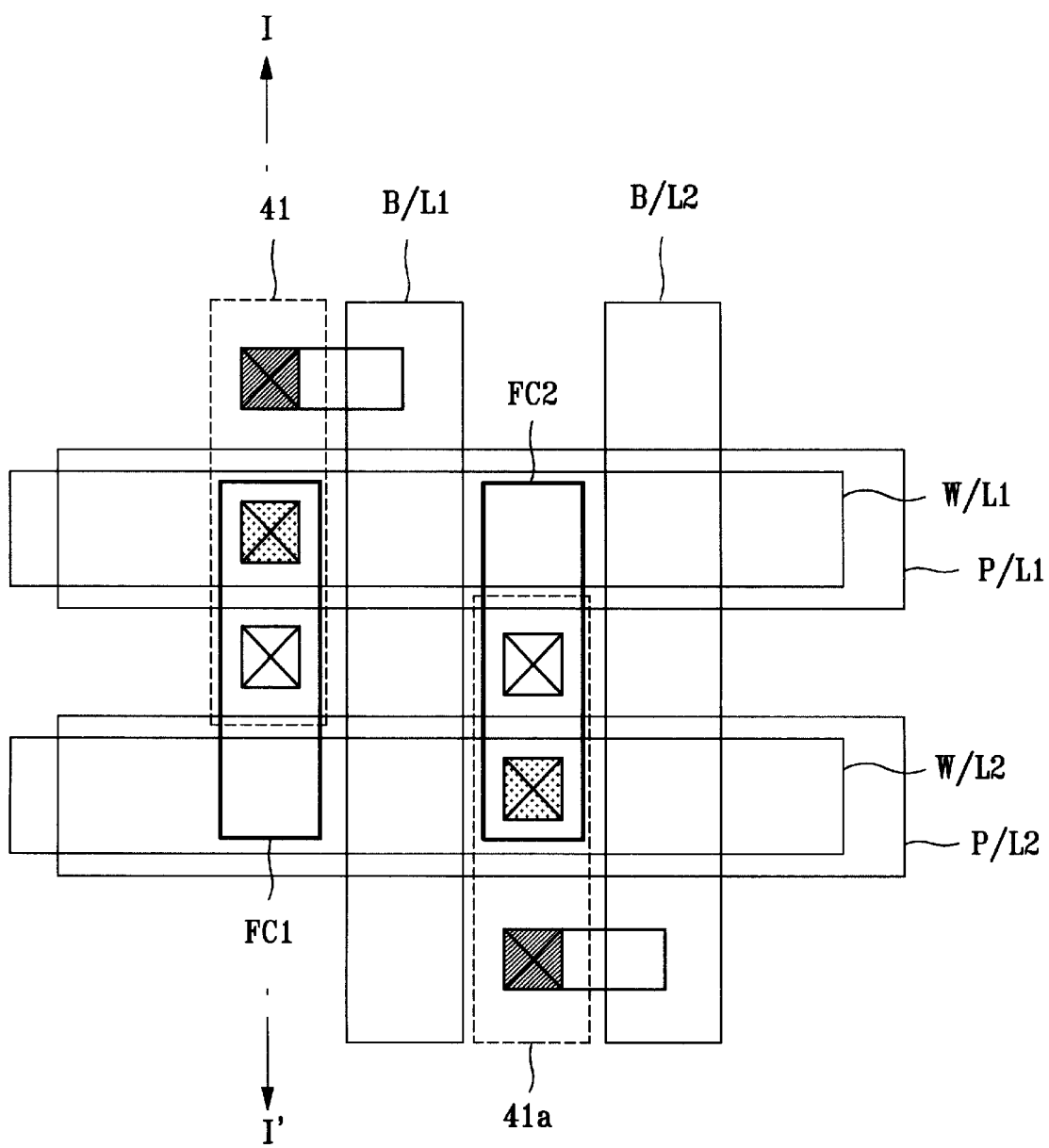
FIG. 4a illustrates a related art nonvolatile ferroelectric memory.
Figure 4B:
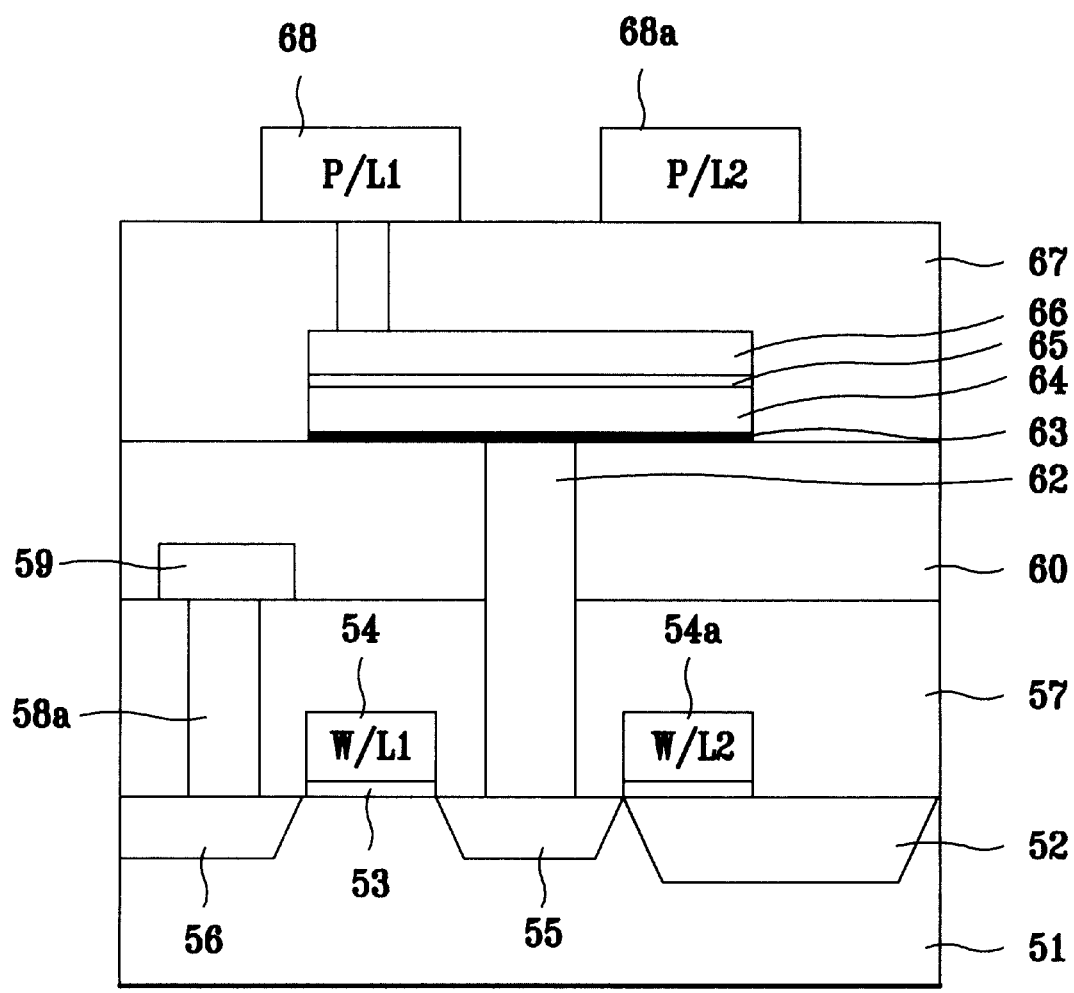
Figure 5A:
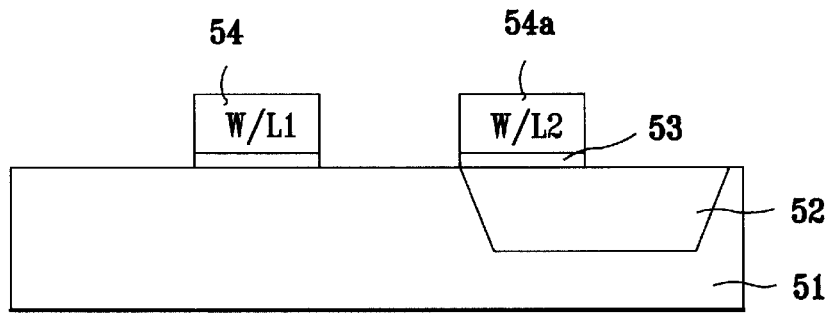
FIGS. 5a~5f illustrate cross-sections along line I-I' in FIG. 4a for describing a method for fabricating the related art nonvolatile ferroelectric memory.
Figure 5B:
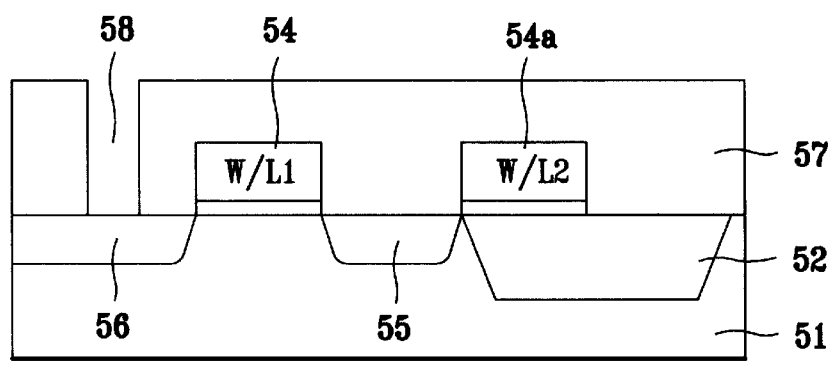
Figure 5C:
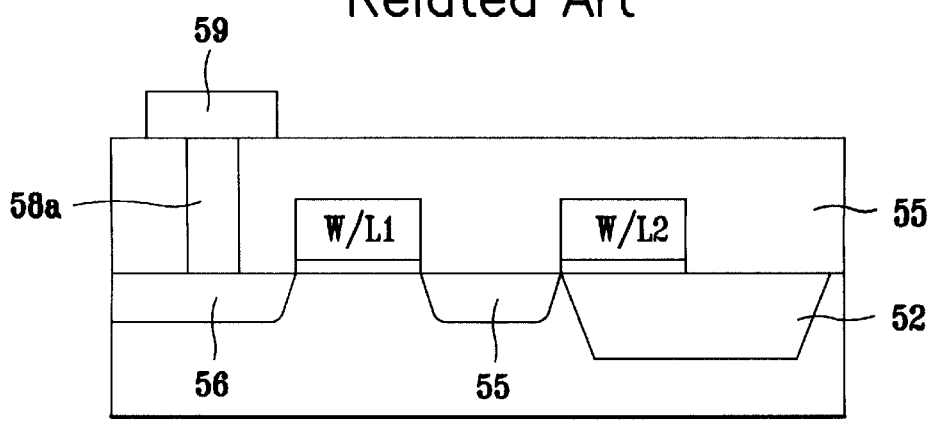
Figure 5D:
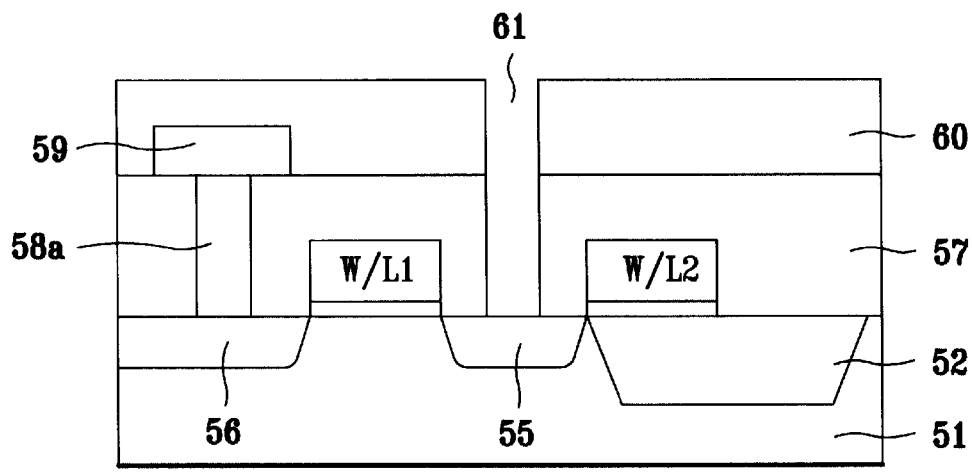
Figure 5E:
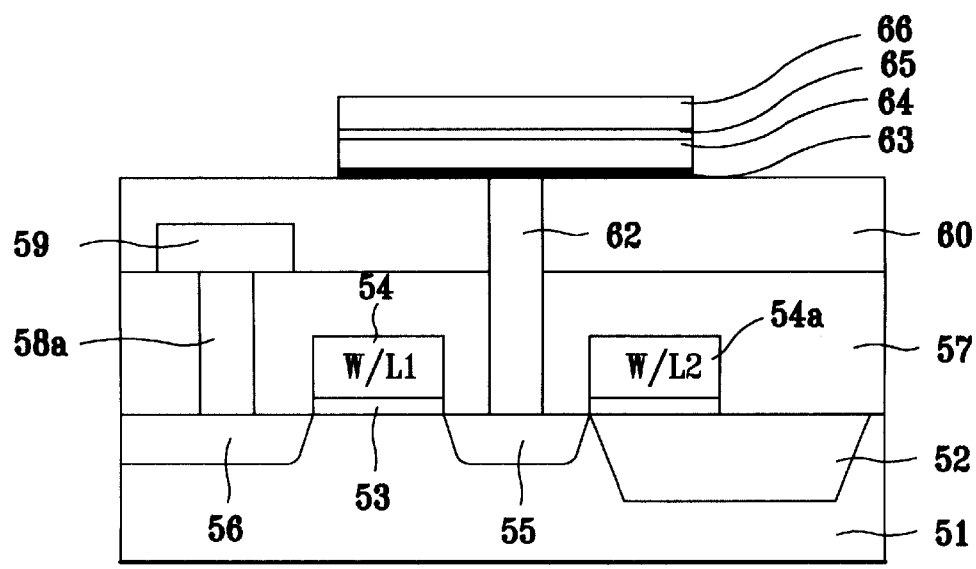
Figure 5F:
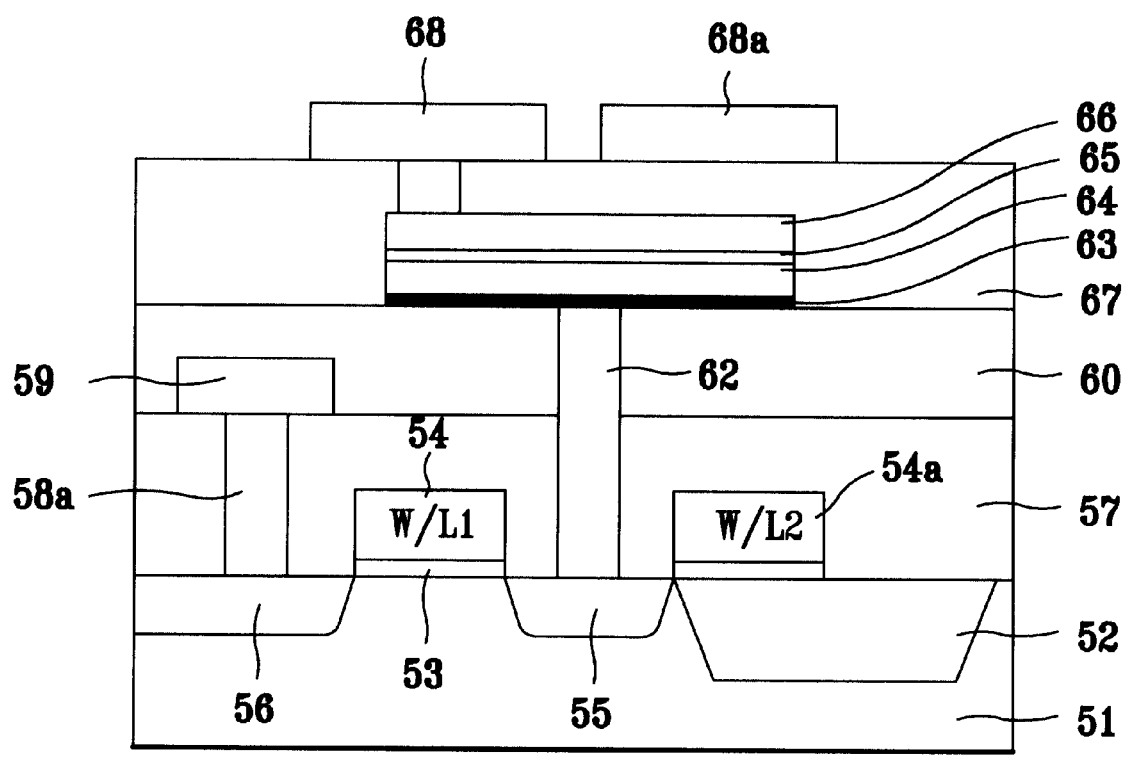
Figure 6:
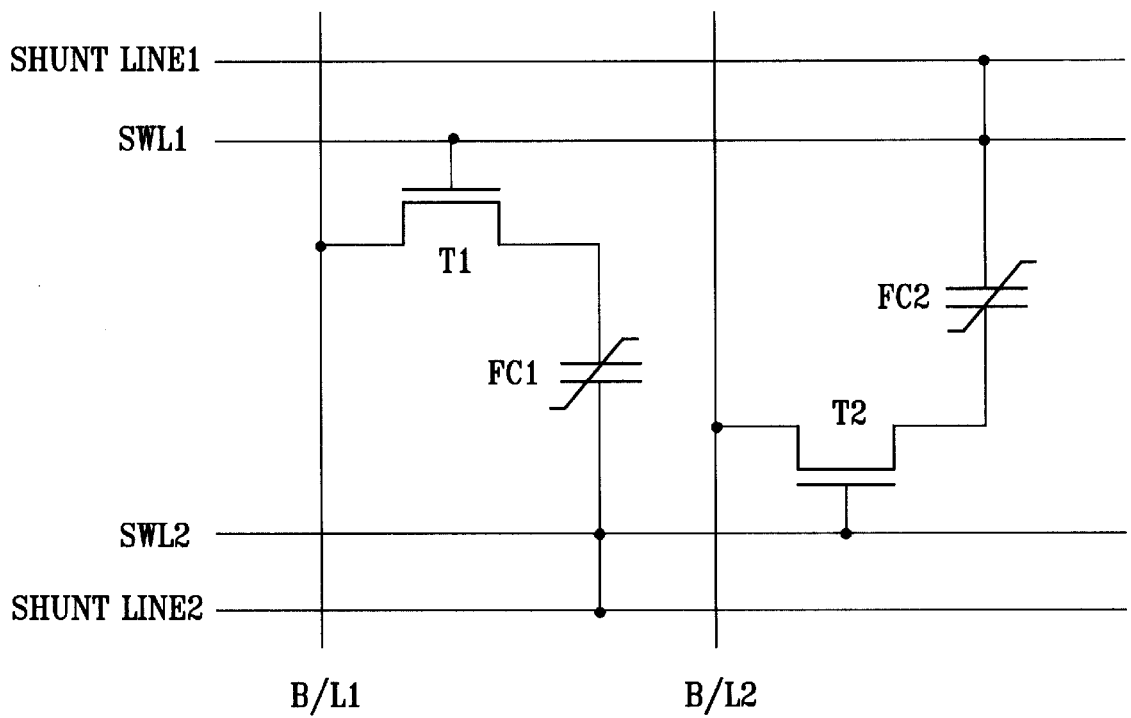
FIG. 6 is a diagram that illustrates a nonvolatile ferroelectric memory unit cell in accordance with preferred embodiments of the present invention.

FIG. 6 is a schematic view showing a unit cell of a nonvolatile ferroelectric memory device according to preferred embodiments of the present invention. As shown in FIG. 6, a unit cell of the nonvolatile ferroelectric memory device includes first and second split wordlines SWL1 and SWL2 formed with a prescribed interval in a row direction, and first and second bitlines B/L1 and B/L2 formed across and preferably substantially perpendicular to the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B2, and a second ferroelectric capacitor FC2 is coupled between a source of the second transistor T2 and the first split wordline SWL1. A plurality of the unit cells constitute a cell array. According to the preferred embodiments, at least one shunt line is coupled to the first and second shift wordlines SWL1 and SWL2.

Figure 7:
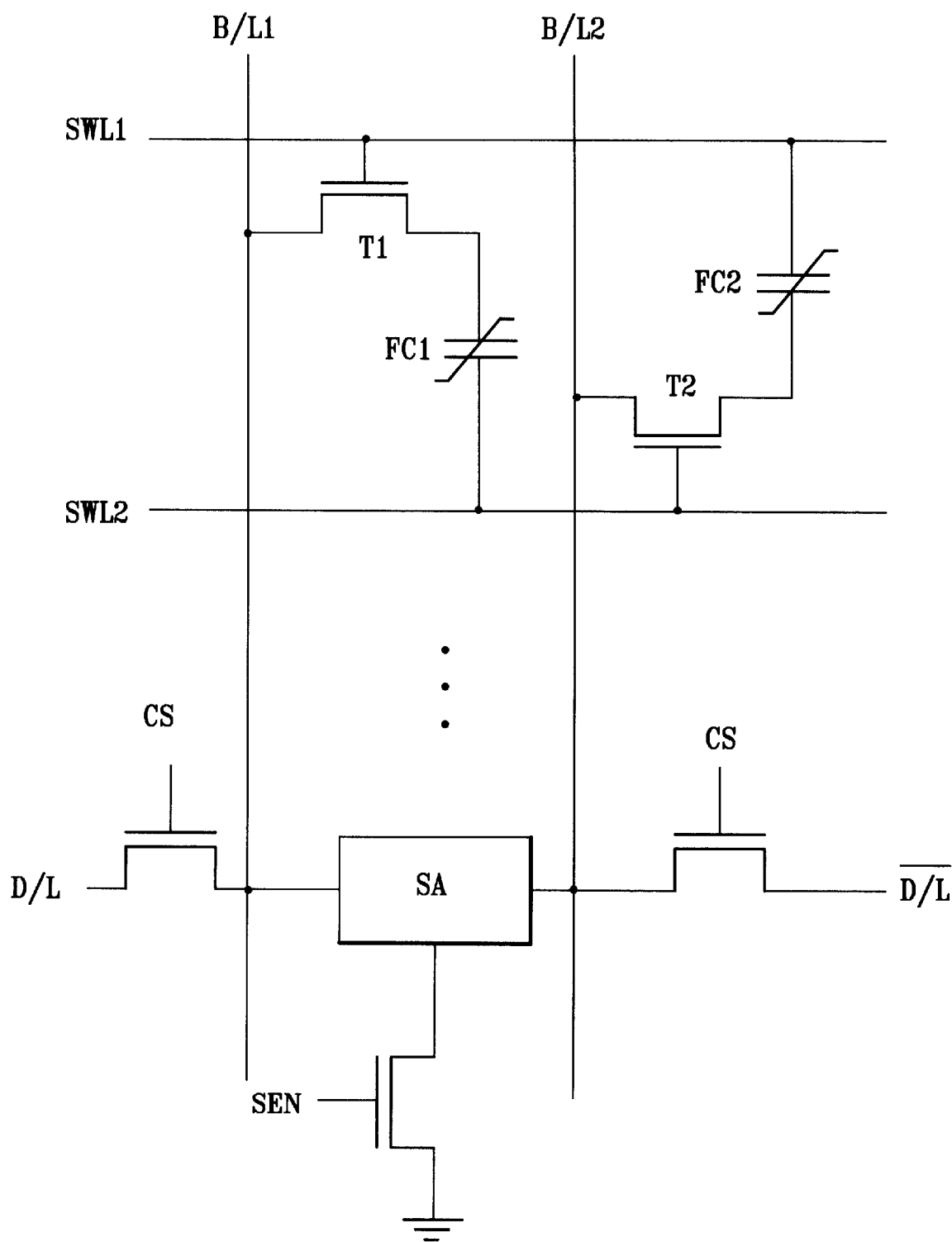
FIG. 7 is a diagram that illustrates a block diagram of preferred embodiments of a nonvolatile ferroelectric memory according to the present invention.

Operations of the nonvolatile ferroelectric memory device will now be described. FIG. 7 is a circuit diagram showing a nonvolatile ferroelectric memory device according to preferred embodiments of the present invention.

As shown in FIG. 7, a plurality of split wordline pairs including first and second split wordlines SWL1 and SWL2 in pairs are preferably formed in row direction. A plurality of bitlines B/L1 and B/L2 are formed across the split wordline pairs. Sensing amplifiers SA are formed between the respective bitlines to sense data transmitted through the bitlines and transfer the sensed data to a data line DL or a data bar line /DL. At this time, a sensing amplifier enable portion and a selection switching portion are provided (not shown). The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 8.

Figure 8:
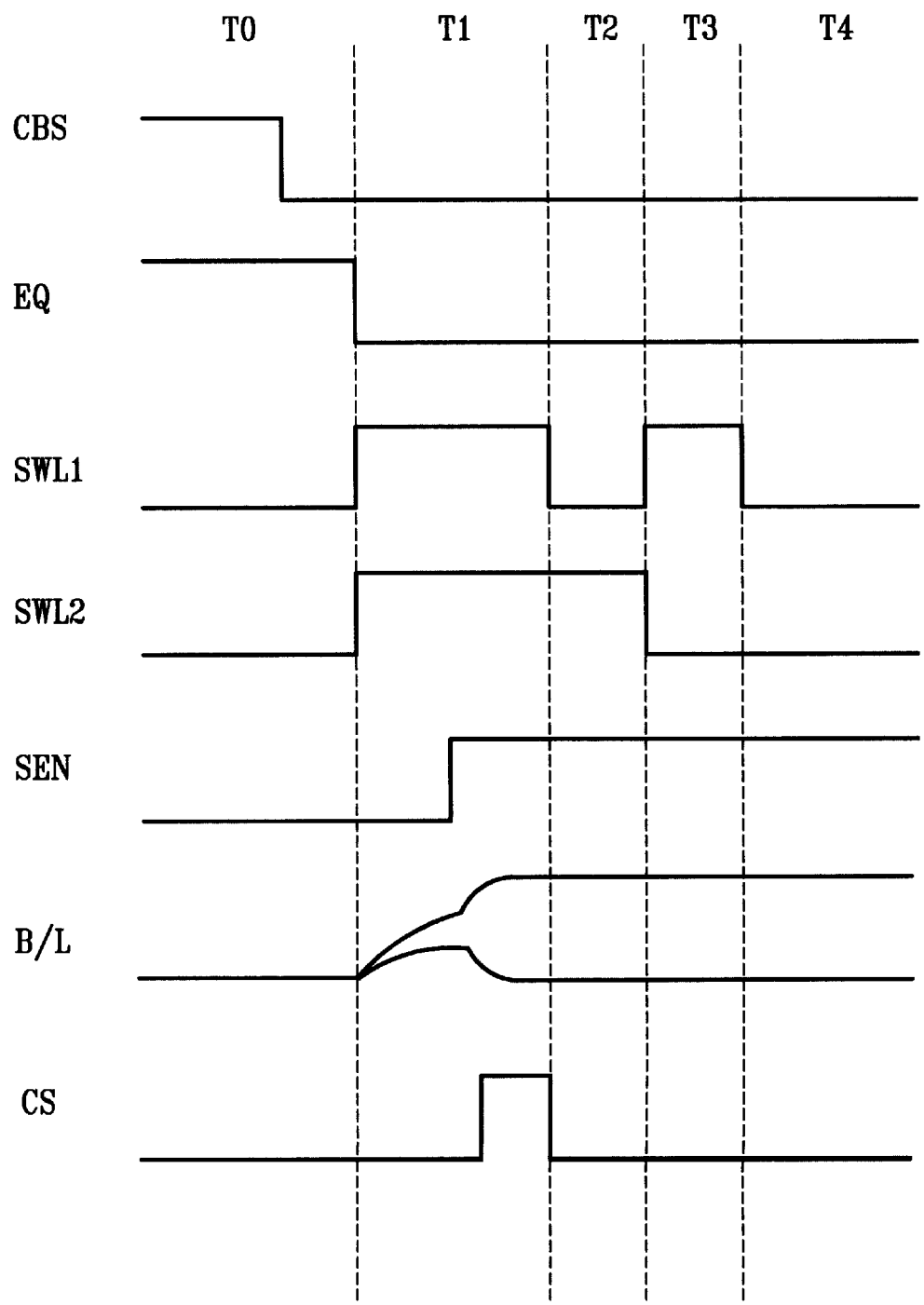
FIG. 8 is a diagram that illustrates a timing diagram for operations of preferred embodiments of a nonvolatile ferroelectric memory according to the present invention.

A T0 period in FIG. 8 denotes a period before the first split wordline SWL1 and the second split wordline SWL2 are activated to "high(H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied.

At this time, in case of the ferroelectric capacitor having a logic value "high", since electric fields having opposite polarities applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In the T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 9:
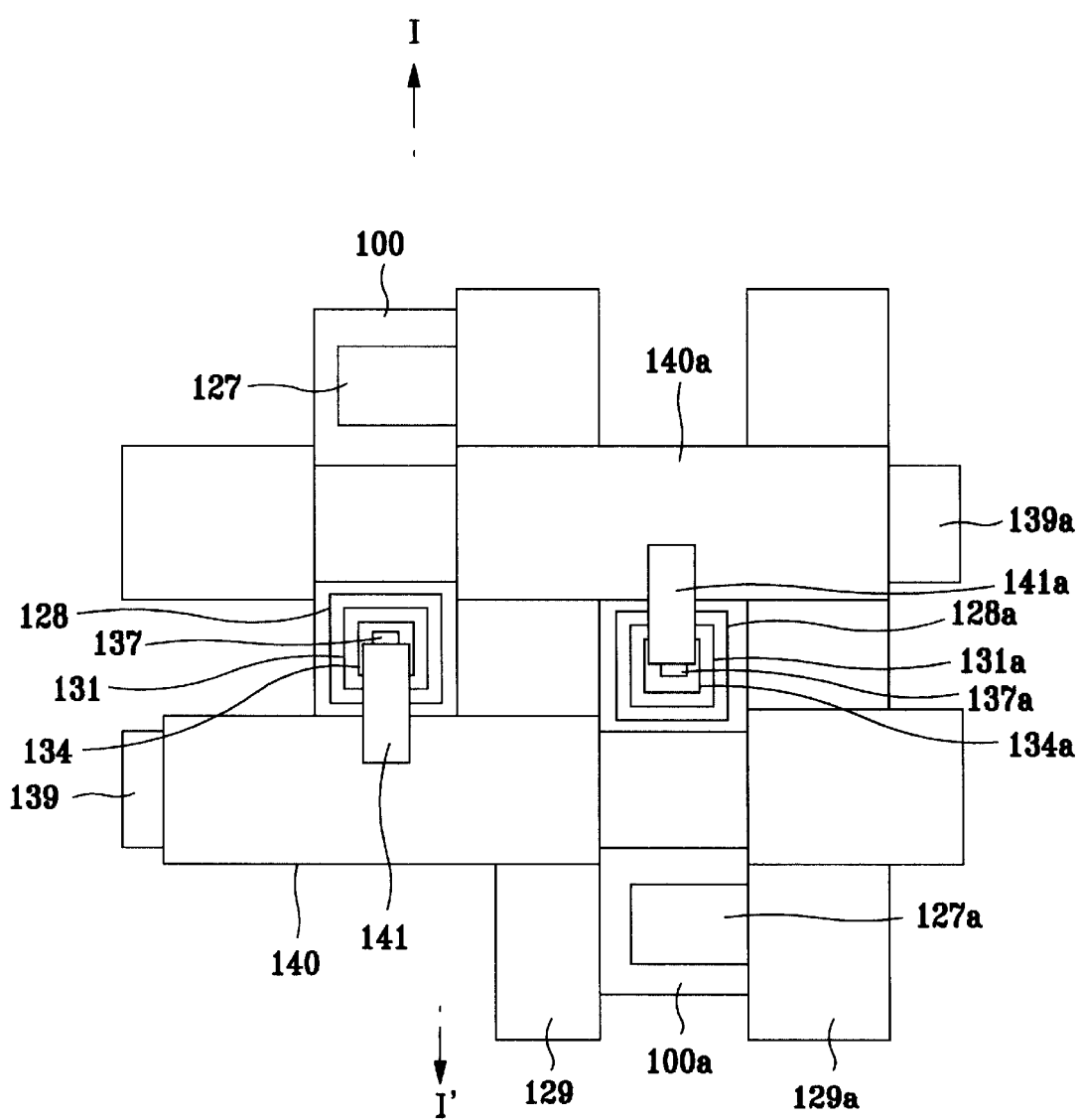
FIG. 9 is a diagram that illustrates a nonvolatile ferroelectric memory in accordance with a preferred embodiment of the present invention.

FIG. 9 is a diagram that illustrates a layout of a first preferred embodiment of a nonvolatile ferroelectric memory in accordance with the present invention. As shown in FIG. 9, a unit cell includes a first active region 100 and a second active region 100a defined in a semiconductor substrate, a first split wordline 123 (not shown) formed to cross the first active region 100 equally dividing the first active region 100 and a second split wordline 123a (not shown) formed to cross the second active region 100a preferably equally dividing the second active region 100a. First source/drain regions (not shown) are defined in the first active region 100 on both sides of the first split wordline 123, and second source/drain regions (not shown) are defined in the second active region 100a on both sides of the first split wordline 123a. First plugs 127 and 127a are respectively coupled to the first and second drain regions and extended to a field region, and second plugs 128 and 128a are respectively coupled to the first and second source regions. First shunt lines (not shown) of a plurality of separated layers are over the first split wordline 123, second shunt lines (not shown) of a plurality of separated layers are over the second split wordline 123a. A first electrode (not shown) of a second ferroelectric capacitor FC2 is formed over the first shunt lines, a first electrode (not shown) of a first ferroelectric capacitor FC1 is formed over the second shunt lines. A second electrode 140 of the first ferroelectric capacitor FC1 is formed over the first electrode of the first ferroelectric capacitor FC1 with a ferroelectric layer 139 disposed inbetween. A second electrode 140a of the second ferroelectric capacitor FC2 is formed over the first electrode of the second ferroelectric capacitor FC2 with a ferroelectric layer 139a disposed inbetween. A first and a second contact layers 141 and 141a coupling second electrodes 140 and 140a of the first and second ferroelectric capacitors and second plugs 128 and 128a. There are third plugs 131 and 131a, fourth plugs 134 and 134a, and fifth plugs 137 and 137a formed between first and second contact layers 141 and 141a and the second plugs 128 and 128a preferably in that order. The first shunt lines and the first electrode of the second ferroelectric capacitor are coupled to the first split wordline 123, and the second shunt lines and the first electrode of the first ferroelectric capacitor are coupled to the second split wordline 123a. The second electrode 140 of the first ferroelectric capacitor is electrically coupled to the first source region, and the second electrode 140a of the second ferroelectric capacitor is electrically coupled to the second source region. The first shunt lines are disposed between the first split wordline 123 and the first electrode of the second ferroelectric capacitor, and the second shunt lines are disposed between the second split wordline 123a and the first electrode of the first ferroelectric capacitor. The first and second shunt lines are preferably formed of metal, such as Pt, and W, and the plug is formed of W. However, the present invention is not intended to be so limited.

Figure 10:
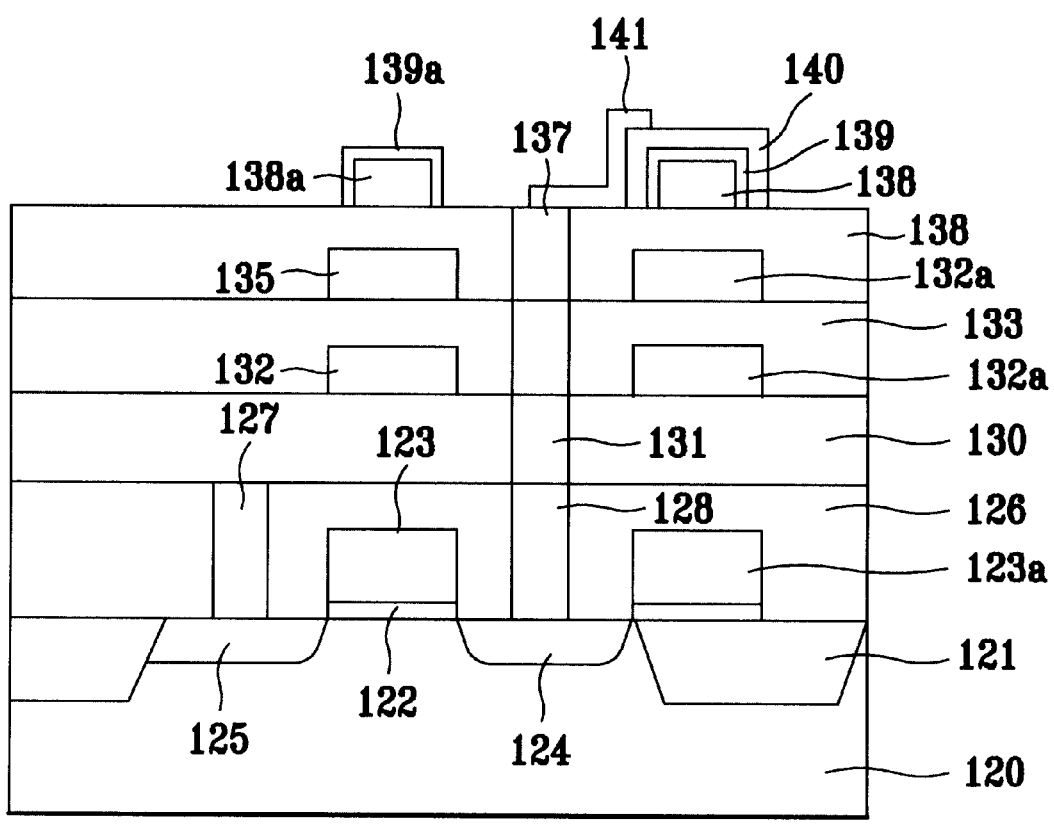
FIG. 10 is a diagram that illustrates a cross-section along line I-I' in FIG. 9.

FIG. 10 is a diagram that illustrates a cross-section along line I–I' in FIG. 9. As shown in FIG. 10, the nonvolatile ferroelectric memory in accordance with the first preferred embodiment of the present invention includes a semiconductor substrate 120 defined as an active region and a field region, a first split wordline 123 formed on the active region of the substrate, a second split wordline 123a formed on the field region of the substrate, and first source/drain regions 124 and 125 formed in the substrate on both sides of the first split wordlines 123 (second source/drain regions formed in the substrate on both sides of the second split wordlines are not shown). A first plug 127 is coupled to the first drain region through a first insulating layer 126 and extended to the field region (the second drain region 125a and the first plug 127a coupled to the second drain region are not shown). A second plug 128 is coupled to the first source region 124 through the first insulating layer 126. The second source region 124a and the second plug 128a coupled to the second source region are not shown. First and second bitlines (not shown) are formed on the field region so as to be coupled to the first plugs 127, 127a. A second insulating layer 130 is formed on an entire surface inclusive of the first and second bitlines, and third plugs 131 and 131a are respectively coupled to the second plugs 128 and 128a through the second insulating layer 130. First conductive layers 132 and 132a are formed on the second insulating layer 130 over the first and second split wordlines 123 and 123a, and a third insulating layer 133 is formed on an entire surface inclusive of the first conductive layers 132 and 132a. Fourth plugs 134 and 134a are respectively coupled to the third plugs 131 and 131a through the third insulating layer 133. Second conductive layers 135 and 135a are formed on the third insulating layer 133 over the first conductive layers 132 and 132a, and a fourth insulating layer 136 is formed on an entire surface inclusive of the second conductive layers 135 and 135a. Fifth plugs 137 and 137a are respectively coupled to the fourth plugs 134 and 134a through the fourth insulating layer 136. A first electrode 138a of the second ferroelectric capacitor FC2 is formed on the fourth insulating layer 136 over the first split wordline 123, and a first electrode 138 of the first ferroelectric capacitor FC1 is formed on the fourth insulating layer 136 over the second split wordline 123a. A first ferroelectric layer 139 is formed on the first electrode 138 of the first ferroelectric capacitor FC1, and a second ferroelectric layer 139a is formed on the first electrode 138a of the second ferroelectric capacitor FC2. A second electrode 140 of the first ferroelectric capacitor FC1 is formed on the first ferroelectric layer 139 (a second electrode 140a of the second ferroelectric capacitor is not shown), and a first contact layer 141 for electrically coupling the second electrode 140 of the first ferroelectric capacitor FC1 and the fifth plug 137 (a second contact layer 141a for electrically coupling the second electrode 140a of the second ferroelectric capacitor and the fifth plug 137a formed at one side of the second split wordline is not shown).

The first conductive layers 132 and 132a and the second conductive layers 135 and 135a are respectively electrically coupled to the first split wordline 123 and the second split wordline 123a, preferably not in the cell region but in a peripheral region, for receiving the same driving signal with relevant split wordlines. The first and second conductive layers 132 and 135 formed between the first split wordline 123 and the first electrode 138a of the second ferroelectric capacitor FC2 are shunt lines of the first split wordline 123, i.e., as first shunt lines, and the first and second conductive layers 132a and 135a formed between the second split wordline 123a and the first electrode 138 of the first ferroelectric capacitor FC1 are shunt lines of the second split wordline 123a, i.e., as second shunt lines. The first conductive layers 132 and 132a and the second conductive layers 135 and 135a are preferably formed of metal, such as Pt and tungsten. The first electrodes 138 and 136a and the second electrodes 140 and 140a of the ferroelectric capacitors are preferably formed of Pt, and the first and second contact layers 141 and 141a are preferably formed of titanium nitride TiN. The second electrode 140 of the first ferroelectric capacitor FC1 is coupled to a source region (e.g., a first source region 124) of the first transistor T1, and the second electrode 140a of the second ferroelectric capacitor FC2 is coupled to a source region (e.g., a second source region 124a) of the second transistor T2.

A preferred embodiment of a method for fabricating a nonvolatile ferroelectric memory according to the present invention will now be described. FIGS. 11a–11l are diagrams that illustrate layouts of the preferred embodiment of the method for fabricating a nonvolatile ferroelectric memory in accordance with the present invention. FIGS. 12a–12l are diagrams that illustrate cross-sections along lines I–I' in FIGS. 11a–11l respectively. The preferred embodiment of the method for fabricating a nonvolatile ferroelectric memory in accordance with the present invention can be used, for example, to fabricate the first preferred embodiment of the nonvolatile ferroelectric memory shown in FIGS. 9–10 and will be described with reference to same.

Figure 11A:
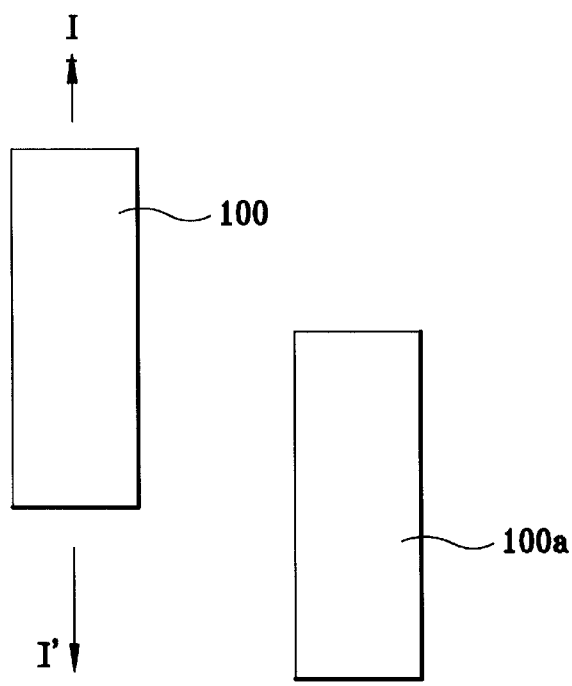
Figure 11B:
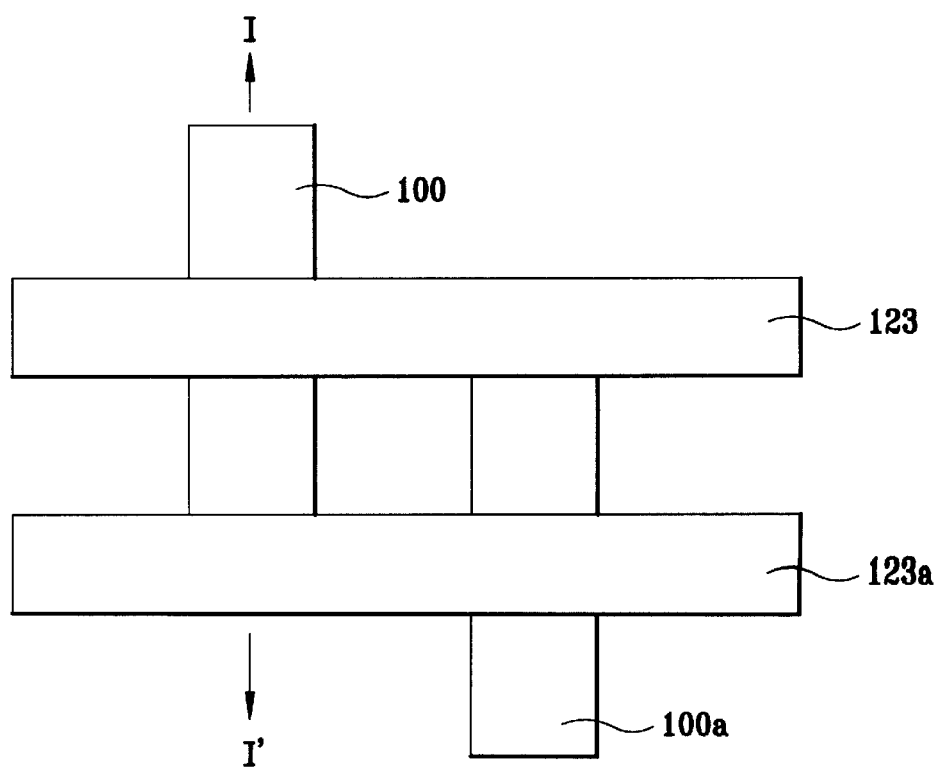

As shown in FIG. 11a, asymmetrical and parallel active regions 100 and 100a are formed at fixed intervals on a first conduction type semiconductor substrate. The region other than the active regions 100 and 100a is a field region (e.g., a device isolation layer) preferably formed by trench isolation. As shown in FIG. 11b, a first split wordline SWL1 123 and a second split wordline SWL2 123a are formed to preferably divide equally in two respective active regions 100 and 100a in a direction crossing the active regions 100 and 100a. The first split wordline 123 serves as a gate electrode of the first transistor T1, and the second split wordline 123a serves as a gate electrode of the second transistor T2. Though not shown in FIG. 11b impurity ions of a conduction type opposite to a conduction type of the substrate are implanted in portions of the substrate on both sides of the first split wordline 123 to concurrently form first source/drain regions at the same time as second source/drain regions are preferably formed on both sides of the second split wordline 123a.

Figure 11C:
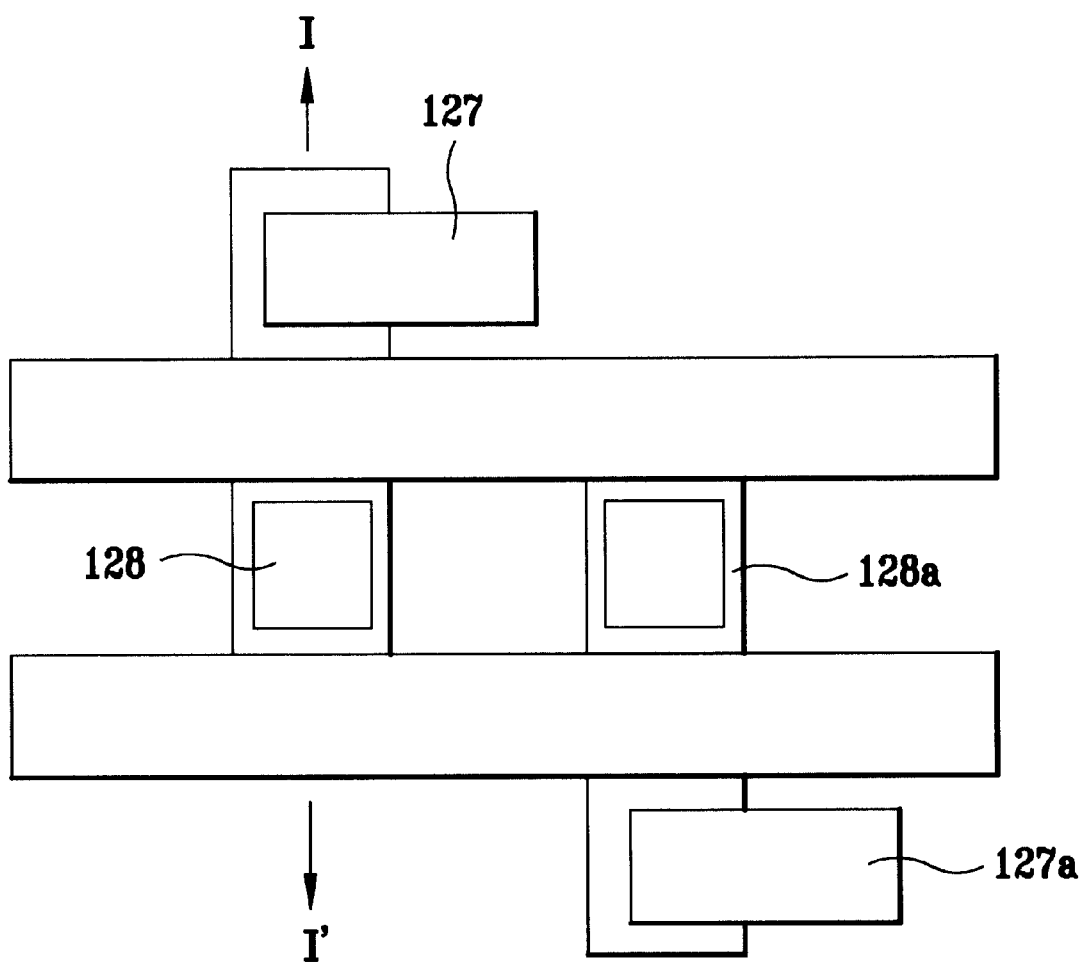

As shown in FIG. 11c, first plugs 127 and 127a, which are respectively coupled to the first and second drain impurity regions, are formed and respectively extended to portions where first and second bitlines are to be formed. Second plugs 128 and 128a, which are respectively coupled to the first and second source impurity regions, are formed since the bitlines will be formed on the device isolation layers between the active regions 100 and 100a, the first plugs 127 and 127a formed on the active regions are patterned such that the first plugs 127 and 127a are extended to the field region. The first and second plugs are preferably formed of polysilicon or a metal, such as tungsten.

Figure 11D:
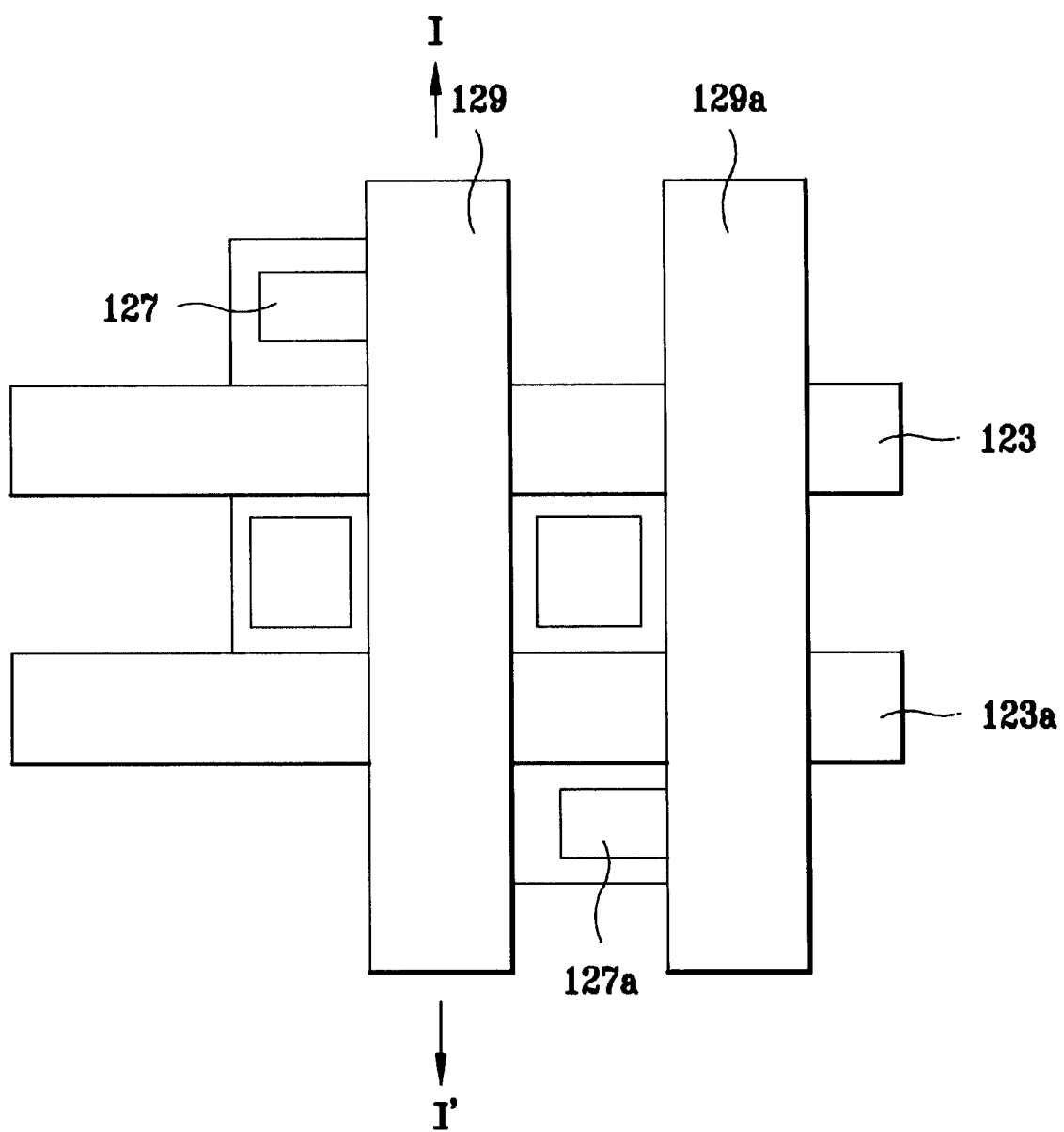
Figure 11E:
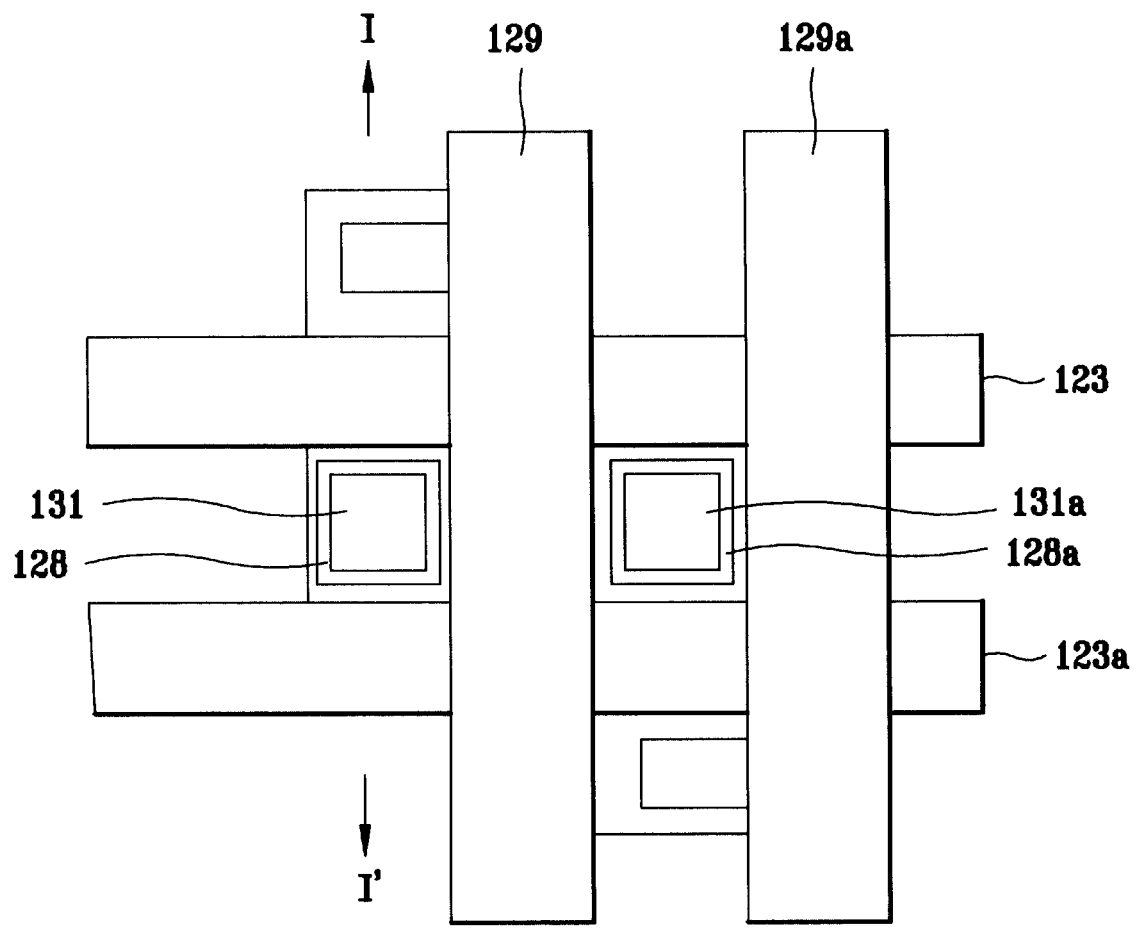

As shown in FIG. 11d, first and second bitlines 129 and 129a are respectively formed at one side of the first and second active regions 100 and 100a to be electrically coupled to the first plugs 127 and 127a. As shown in FIG. 11e, an ILD layer (not shown) is formed on an entire surface inclusive of the first and second bitlines 129 and 129a as an insulating film, and a surface of the ILD layer is planarized. The ILD layer is etched until the second plugs 128 and 128a are exposed to form contact holes. Polysilicon or a metal, such as tungsten or the like, is stuffed in the contact holes, to form third plugs 131 and 131a respectively electrically coupled to the second plugs 128 and 128a, electrically.

Figure 11F:
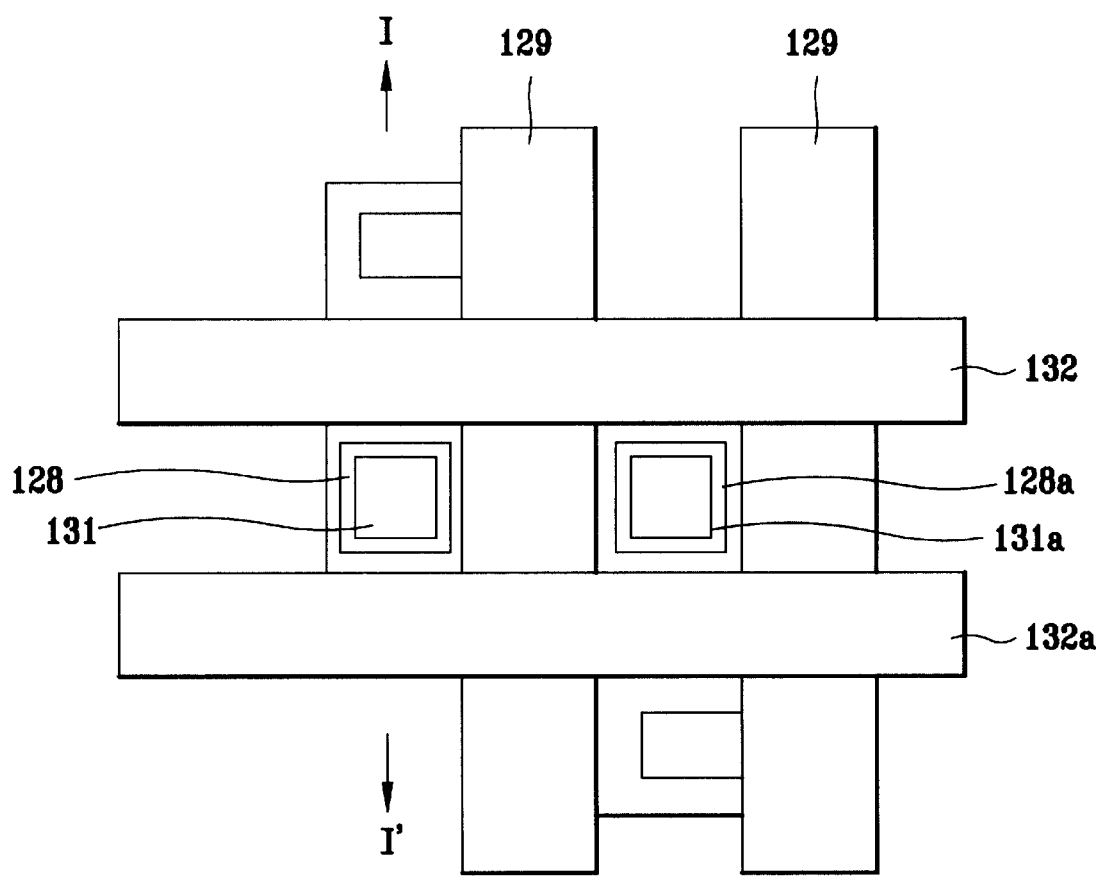

As shown in FIG. 11f, first conductive layers 132 and 132a are formed in a direction crossing the first and second bitlines 129 and 129a, but insulated from the first and second bitlines 129 and 129a, and will be used as first shunt lines. The first conductive layers 132 and 132a are formed over, and extending along the direction of the first and second split wordlines 123 and 123a. The first conductive layers 132 and 132a are preferably formed of a metal, such as Pt and tungsten. An ILD layer is formed after the first conductive layers 132 and 132a are formed, and planarized by CMP.

Figure 11G:
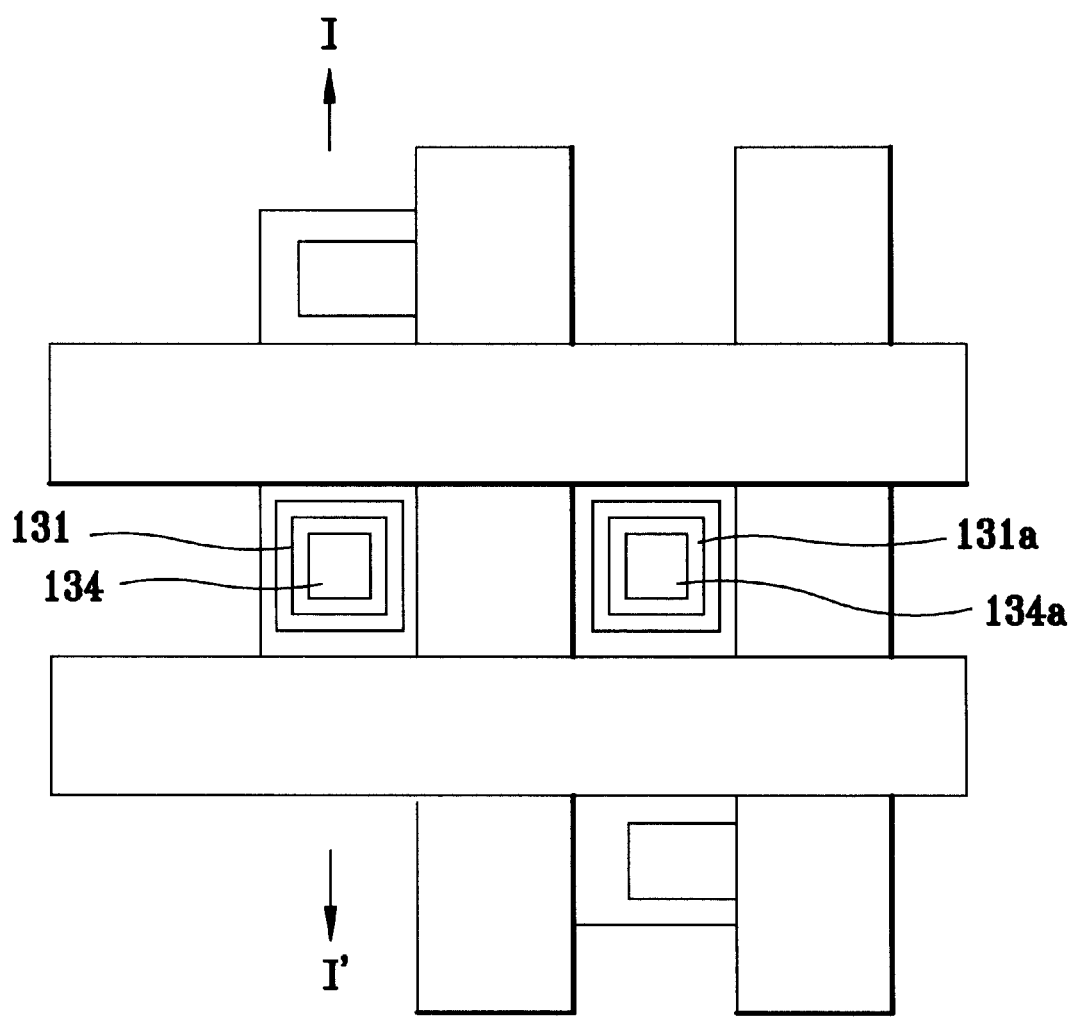
Figure 11H:
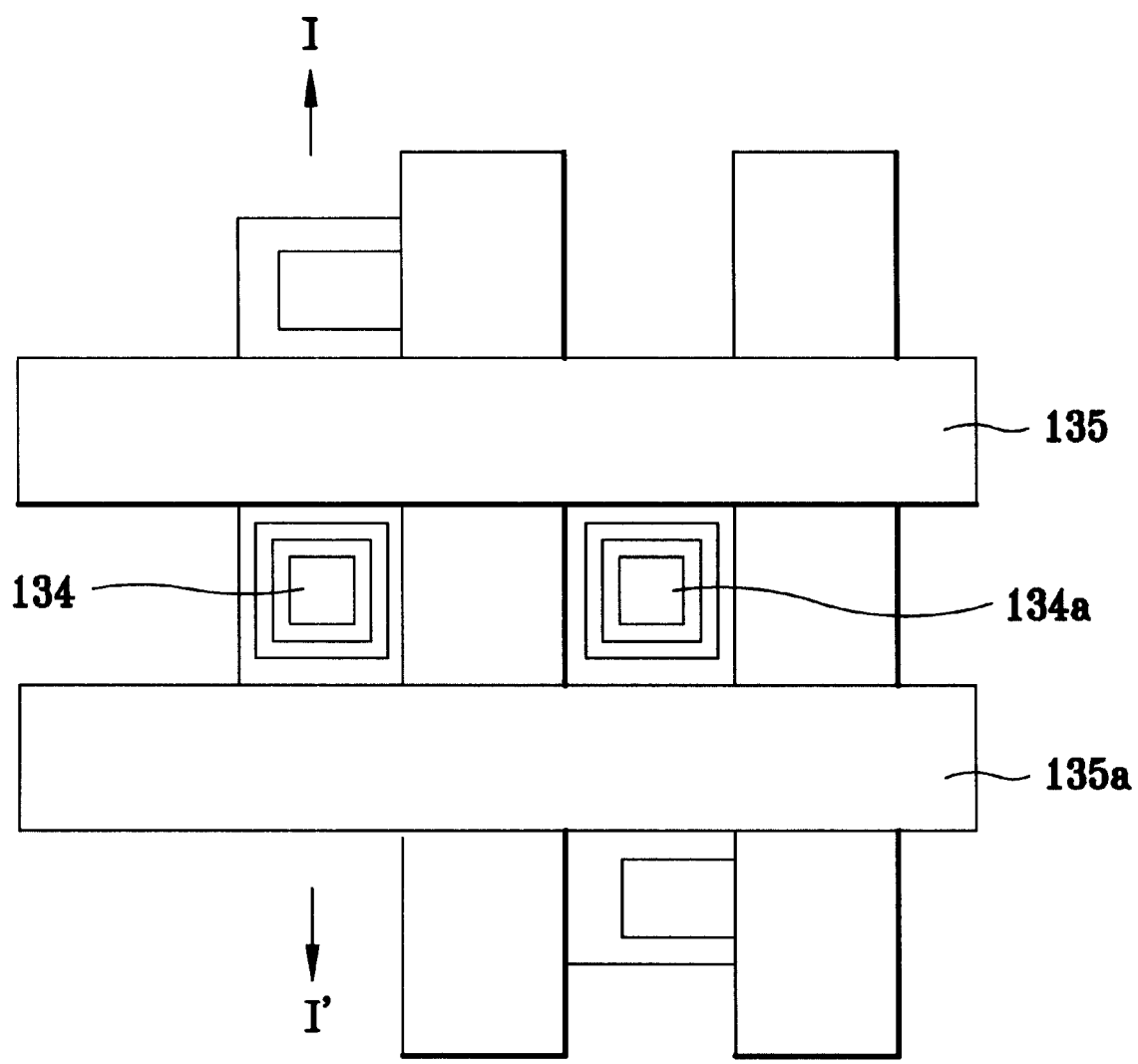

As shown in FIG. 11g, the ILD layer is etched until the third plugs 131 and 131a are exposed to form contact holes. The contact holes are preferably stuffed with polysilicon or a metal, such as tungsten, to form fourth plugs 134 and 134a respectively electrically coupled to the third plugs 131 and 131a. As shown in FIG. 11h, second conductive layers 135 and 135a are formed extending along the direction of the first conductive layers 132 and 132a and will be used as second shunt lines. The second conductive layers 135 and 135a are preferably formed of a material identical to the material of the first conductive layers 132 and 132a. Thereafter, an ILD layer is formed, and planarized. In the formation of the first conductive layers 132 and 132a and the second conductive layers 135 and 135a, which will be used as shunt lines of the split wordlines, widths of the first conductive layers 132 and 132a and the second conductive layers 135 and 135a are preferably formed smaller or equal to widths of the first, or second split wordlines 123 or 123a. However, the present invention is not intended to be so limited. Further, more or fewer conductive layers (e.g., shunt lines) may also be formed, even though this preferred embodiment according to the present invention shows formation of up to second conductive layers.

Figure 11I:
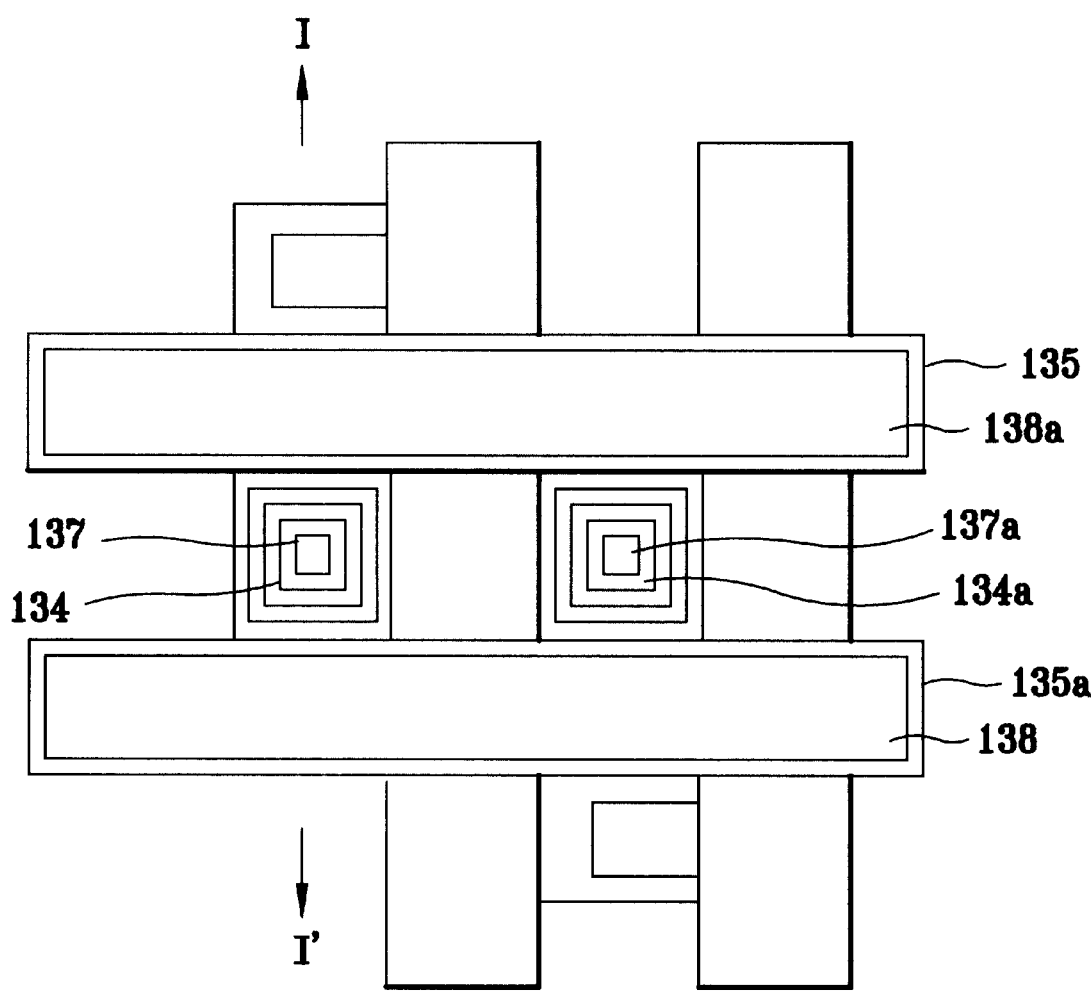

As shown in FIG. 11i, an ILD layer is formed on an entire surface inclusive of the second conductive layers 135 or 135a, and planarized by CMP. The ILD layer is patterned until the fourth plugs 134 and 134a are exposed to form contact holes, which are preferably stuffed with polysilicon or tungsten, to form fifth plugs 137 and 137a. Then, a first electrode 138 of the first ferroelectric capacitor and a first electrode 138a of the second ferroelectric capacitor are formed extending along the direction of the second conductive layers 135 and 135a are formed. The first electrodes 138 and 138a of the first and second ferroelectric capacitors are preferably formed of a metal, such as Pt. As shown in FIG. 11i, widths of the first electrodes 138 and 138a of the first and second ferroelectric capacitors are preferably patterned smaller than widths of the second conductive layers 135 and 135a.

Figure 11J:
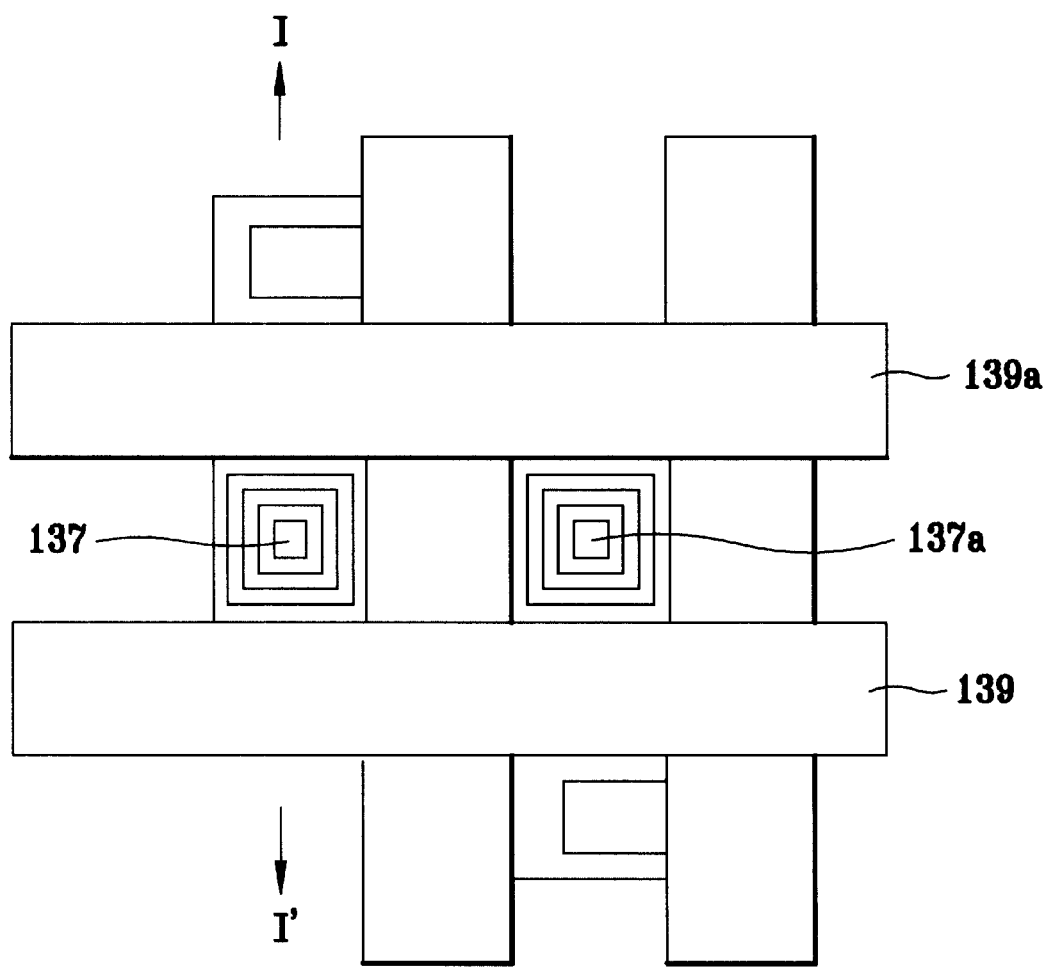

As shown in FIG. 11j, first and second ferroelectric films 139 and 139a are formed to cover sides and top surfaces of the first electrodes 138 and 138a of the ferroelectric capacitors. The first ferroelectric film 139 is preferably used as a dielectric film of the first ferroelectric capacitor FC1, and the second ferroelectric film 139a is used as a dielectric film of the second ferroelectric capacitor FC2.

Figure 11K:
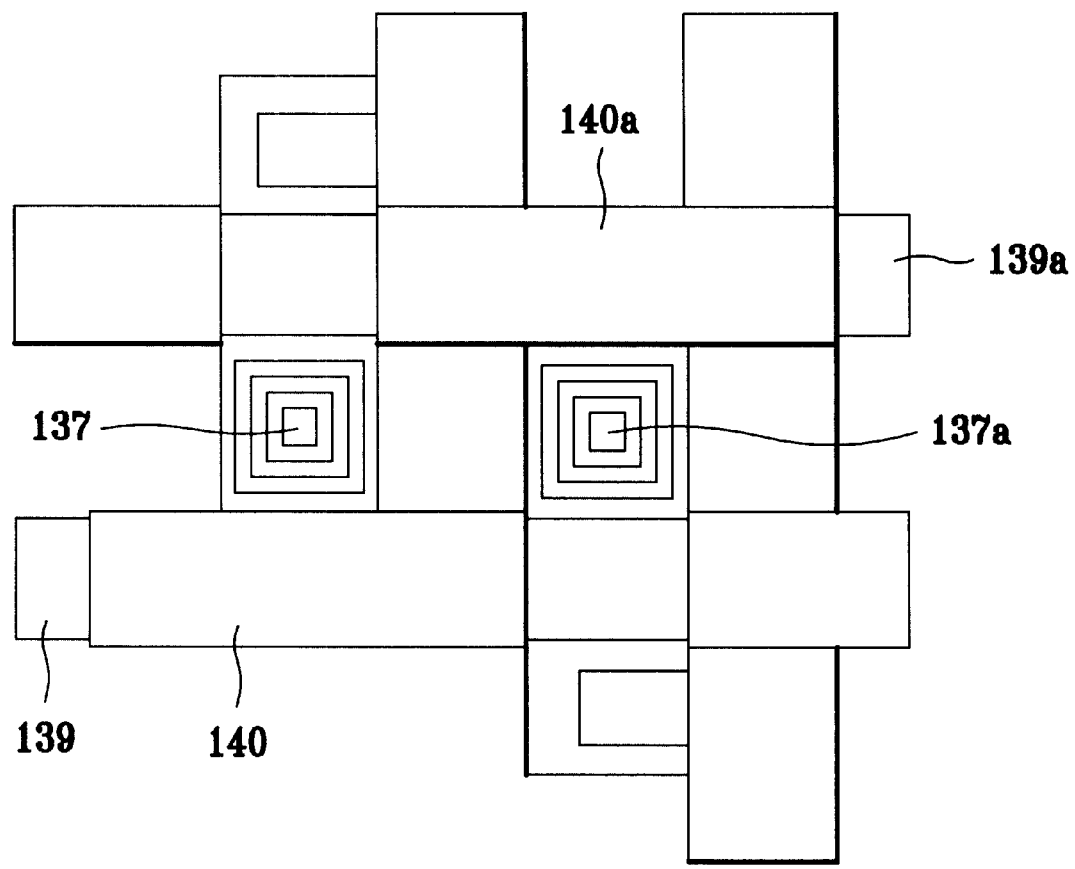
Figure 11I:
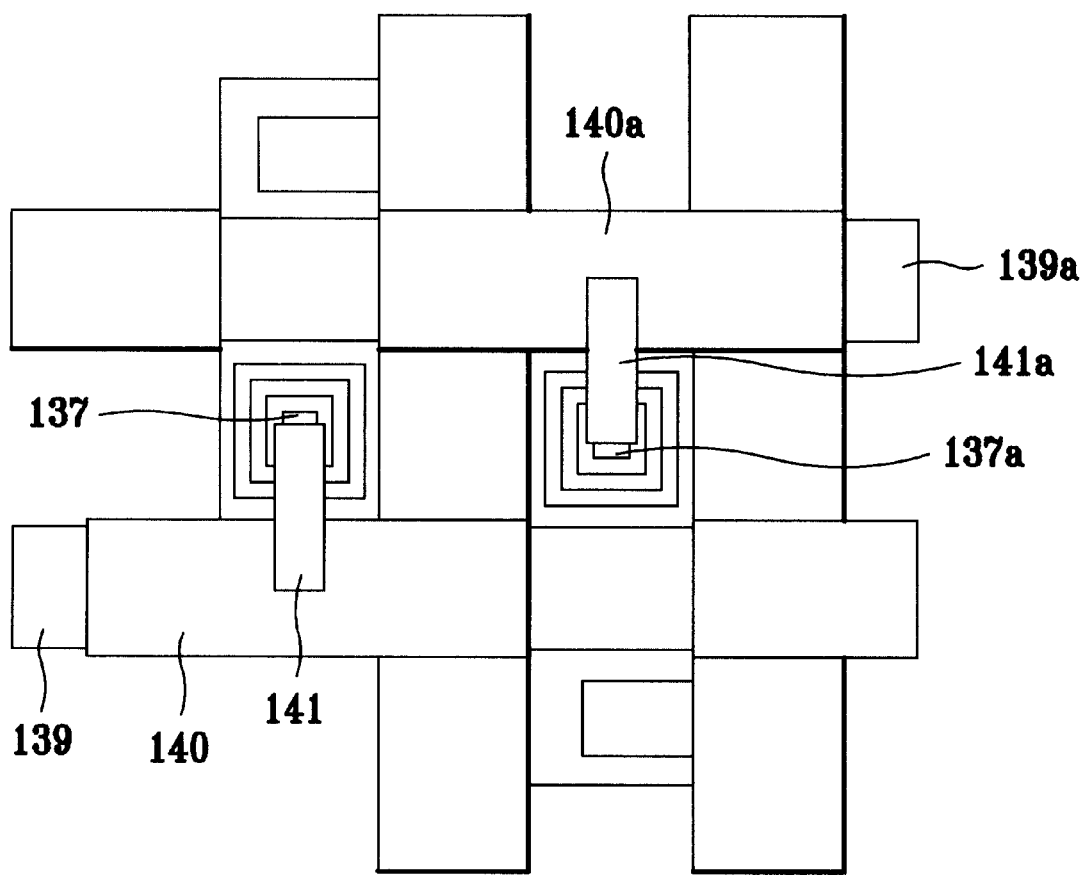

As shown in FIG. 11k, material layers for second electrodes of the ferroelectric capacitors are formed on the first and second ferroelectric films 139 and 139a and patterned to remain only on the field region, which preferably makes island forms of second electrodes 140 and 140a of the ferroelectric capacitors. The reference numeral "140" denotes the second electrode of the first ferroelectric capacitor, and the reference numeral "140a" denotes the second electrode of the second ferroelectric capacitor. The second electrodes of the ferroelectric capacitors are preferably formed of a material identical to a material of the first electrodes.

As shown in FIG. 11l, a first contact layer 141 is preferably formed for coupling the second electrode 140 of the first ferroelectric capacitor to the fifth plug 137, and a second contact layer 141a is formed for coupling the second electrode 140a of the second ferroelectric capacitor to the fifth plug layer 137a. The first contact layers 141 and 141a are preferably formed of titanium nitride. After the first and second contact layers 141 and 141a are formed, upon formation of a protection film for protecting the ferroelectric capacitors, the preferred embodiment of the method for fabricating the nonvolatile memory of the present invention is completed. As shown in FIGS. 11a–11l, the source region of the first transistor T1 is electrically coupled to the second electrode 140 of the first ferroelectric capacitor FC1 by the second plugs 128, the third plugs 131, the fourth plugs 134, and the fifth plugs 137, and the first contact layer 141, and the source region of the second transistor T2 is electrically coupled to the second electrode 140a of the second ferroelectric capacitor FC2 by the second plugs 128a, the third plugs 131a, the fourth plugs 134a, and the fifth plugs 137a, and the second contact layer 141a. The first split wordlines and the first and second conductive layers 132 and 135, the second split wordline and the first and second conductive layers 132a and 135a are electrically coupled, not to the cell region, but outside of the device, to receive the same driving signal.

Figure 12A:
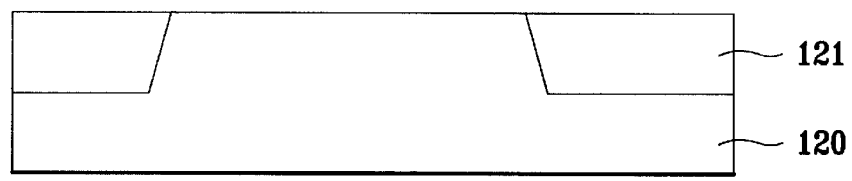
FIGS. 12a~12l are diagrams that illustrate sections along lines I-I' in FIGS. 11a~11l respectively of a method for fabricating a nonvolatile ferroelectric memory in accordance with a preferred embodiment of the present invention.
Figure 12B:
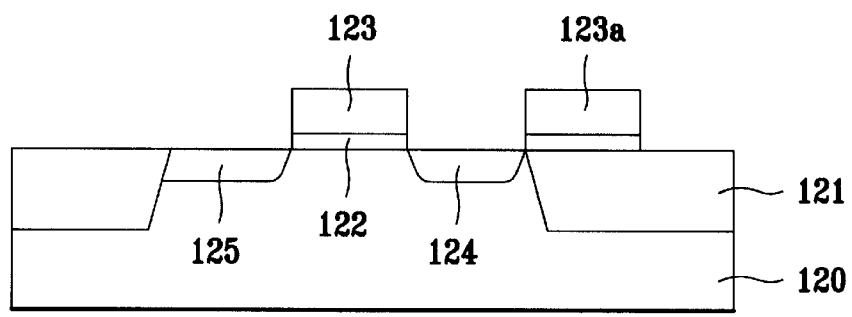

The preferred embodiment of the method for fabricating the nonvolatile ferroelectric memory in accordance with the present invention will now be described using sectional drawings. As shown in FIG. 12a illustrating a cross-section along a line I–I' in FIG. 11a, a semiconductor substrate 120 is defined in active regions and field regions 121. The field regions 121 are preferably formed by trench isolation. As shown in FIG. 12b illustrating a cross-section along a line I–I' in FIG. 11b, a first split wordline 123 and a second split wordline 123a are formed over active regions and field regions of the substrate 120 with a gate insulating film 122 disposed inbetween. The first split wordline 123 is used as a gate electrode of the first transistor T1, and the second split wordline 123a is used as a gate electrode of the first transistor T2. Impurity ions are implanted using the first and second split wordlines 123 and 123a as masks to form first source/drain regions 124 and 125 to be used as source/drain of the first transistor T1 and second source/drain regions 124a and 125a (not shown) to be used as source/drain of the second transistor T2.

Figure 12C:
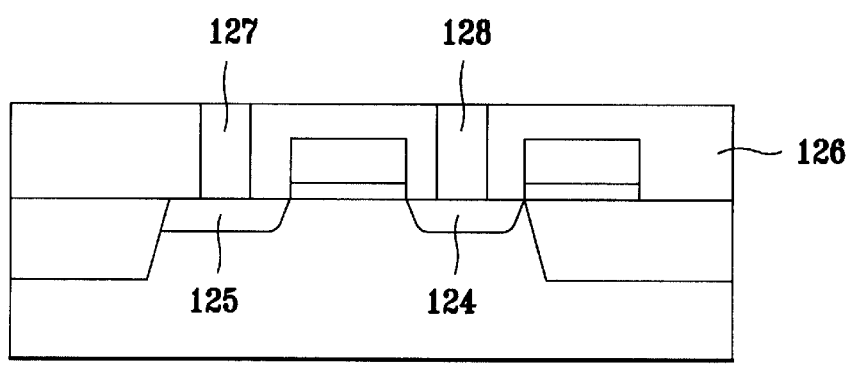

As shown in FIG. 12c illustrating a cross-section along a line I–I' in FIG. 11c, a first insulating layer 126 is formed on an entire surface of the substrate inclusive of the first and second split wordlines 123 and 123a. The first insulating layer 126 is preferably an ILD layer. Then, the first insulating layer 126 is planarized by chemical mechanical polishing (CMP) or the like, and the first insulating layer 126 is patterned until the first and second source regions 124 and 124a and the first and second drain regions 125 and 125a are exposed, to form contact holes. The contact holes are stuffed with polysilicon or a metal, such as tungsten, to form first plug layers 127 and 127a coupled to the first and second drain regions 125 and 125a used as drains of the first and second transistors T1 and T2, and second plug layers 128 and 128a coupled to the first and second source regions 124 and 124a used as sources of the first and second transistors T1 and T2. The first plug layers 127 and 127a are extended to the field region for electrical coupling to corresponding bitlines, which are formed later.

Figure 12D:
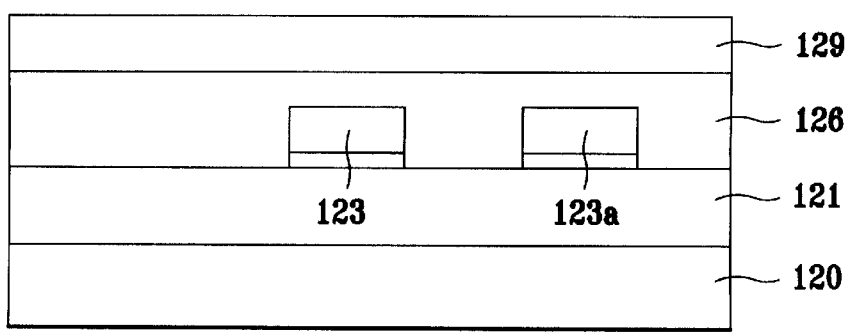
Figure 12E:
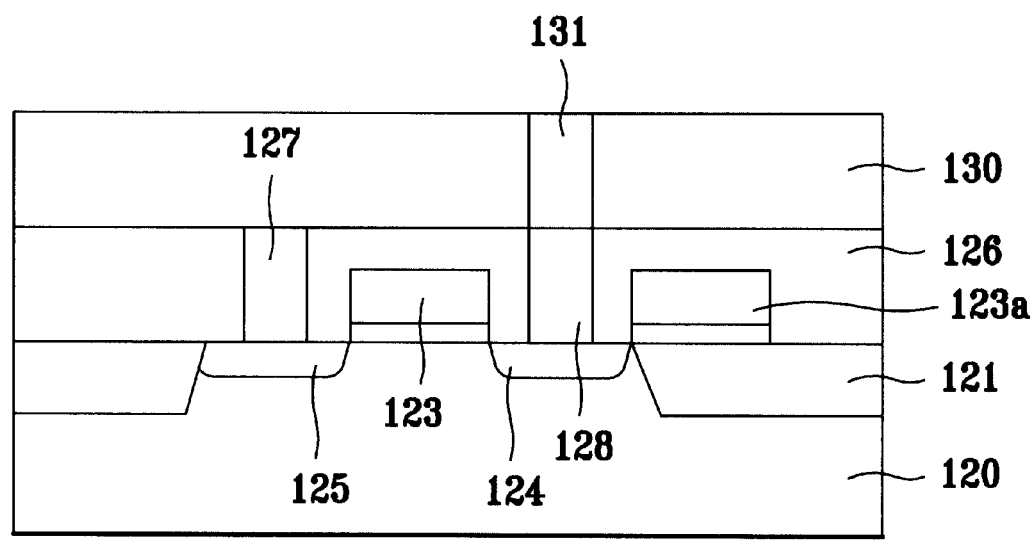

As shown in FIG. 12d illustrating a cross-section along a line I–I' in FIG. 11d, a first bitline 129 and a second bitline 129a (not shown) are formed on the field region on one side of the active region. The first bitline 129 and second bitline 129a are electrically coupled to the first plug layers 127 and 127a extended to the field region, respectively. As shown in FIG. 12e illustrating a cross-section along a line I–I' in FIG. 11e, a second insulating layer 130 is formed on an entire surface inclusive of the first and second bitlines (not shown), and planarized by CMP. The second insulating layer 130 is preferably an ILD layer. Then, contact holes are formed in the second insulating layer 130 to expose the second plug layers 128 and 128a coupled to the first source region 124 and the second source region 124a (not shown), and stuffed with polysilicon or a metal, such as tungsten, to form third plug layers 131 and 131a (not shown) electrically coupled to the second plug layers 128 and 128a.

Figure 12F:
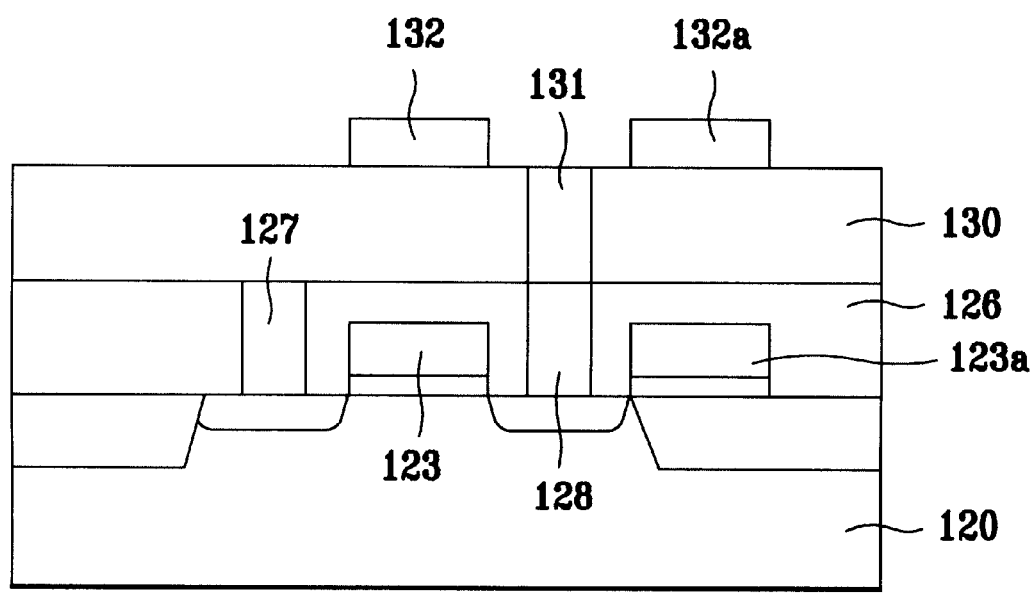

As shown in FIG. 12f illustrating a cross-section along a line I–I' in FIG. 11f, first conductive layers 132 and 132a are formed on the second insulating layer 130 over the first split wordline 123 and the second split wordline 123a. The first conductive layers 132 and 132a are formed of a metal, such as Pt and tungsten, and each has a width preferably smaller or equal to a width of the corresponding split wordline.

Figure 12G:
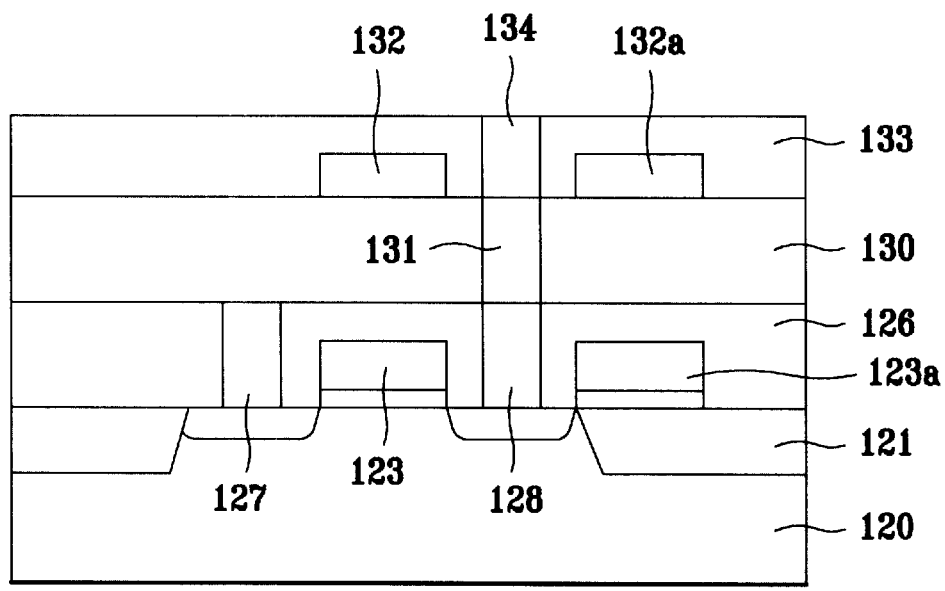

As shown in FIG. 12g illustrating a cross-section along a line I–I' in FIG. 11g, a third insulating layer 133 is formed on an entire surface inclusive of the first conductive layers 132 and 132a, and planarized by CMP. The third insulating layer 133 is preferably an ILD layer. The third insulating layer 133 is patterned until the third plugs 131 and 131a are exposed, to form contact holes. The contact holes are stuffed with polysilicon or a metal, such as tungsten, to form fourth plugs 134 and 134a coupled to the third plugs 131 and 131a.

Figure 12H:
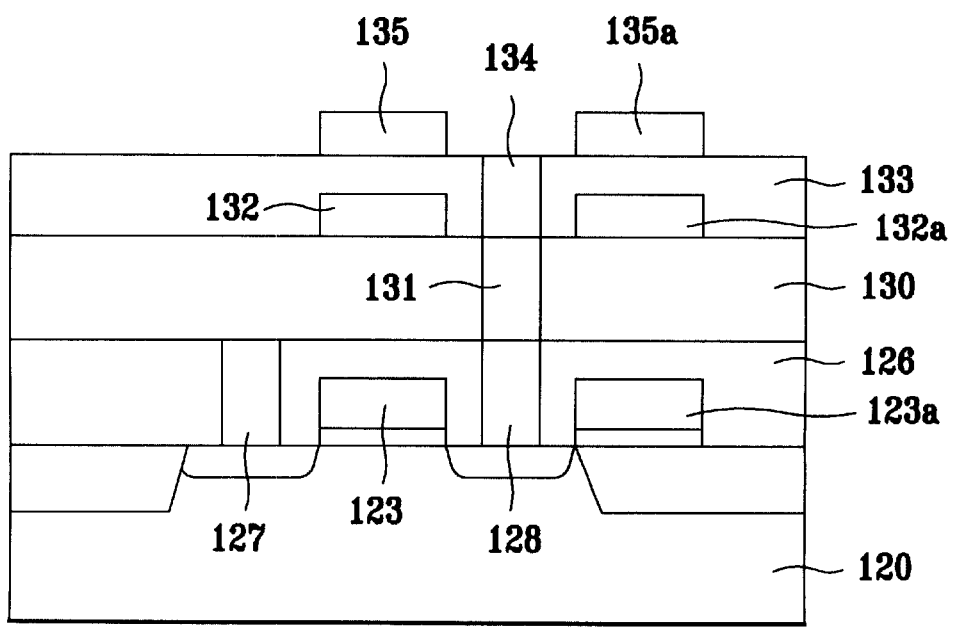
Figure 12I:
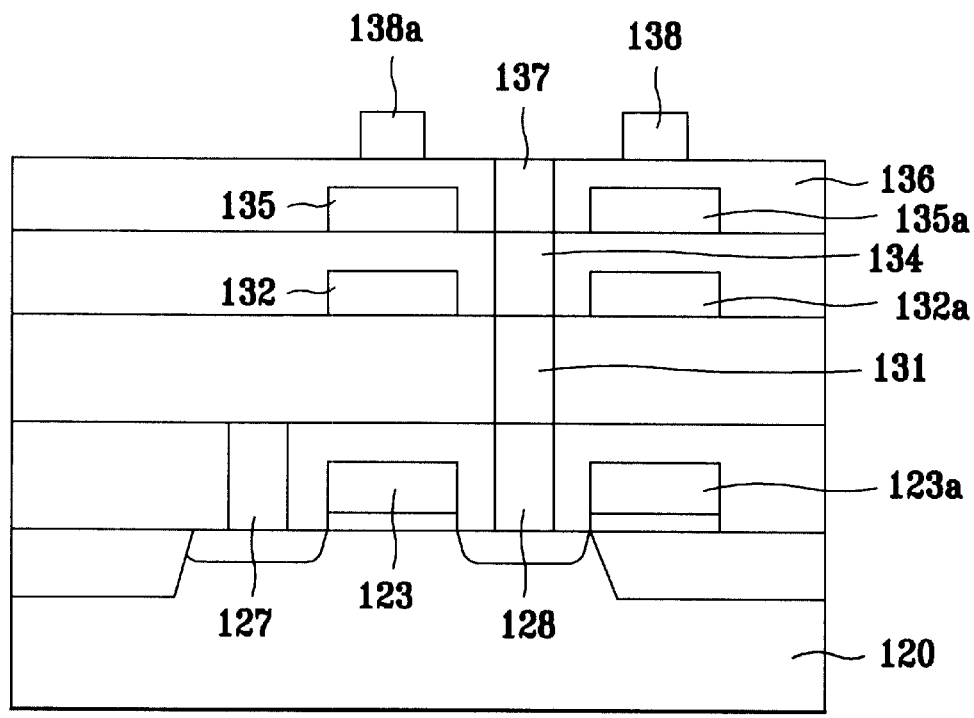

As shown in FIG. 12h illustrating a cross-section along a line I–I' in FIG. 11h, second conductive layers 135 and 135a are preferably formed on the third insulating layer 133 over the first conductive layers 132 and 132a. The second conductive layers 135 and 135a are preferably formed of a material identical to a material of the first conductive layers. As shown in FIG. 12i illustrating a cross-section along a line I–I' in FIG. 11i, a fourth insulating layer 136 is formed on an entire surface of the substrate inclusive of the second conductive layers 135 and 135a, planarized by CMP, and patterned until the fourth plugs 134 and 134a are exposed, to form contact holes. The contact holes are stuffed with polysilicon or tungsten, to form fifth plugs 137 and 137a. A first electrode 138 of the first ferroelectric capacitor and a first electrode 138a of the second ferroelectric capacitor are formed on the fourth insulating layer 136 over the second conductive layers 135 and 135a, respectively. The first electrodes 138 and 138a of the first and second ferroelectric capacitors are patterned to preferably have widths smaller than widths of the first and second conductive layers 135 and 135a, and formed of Pt.

Figure 12J:
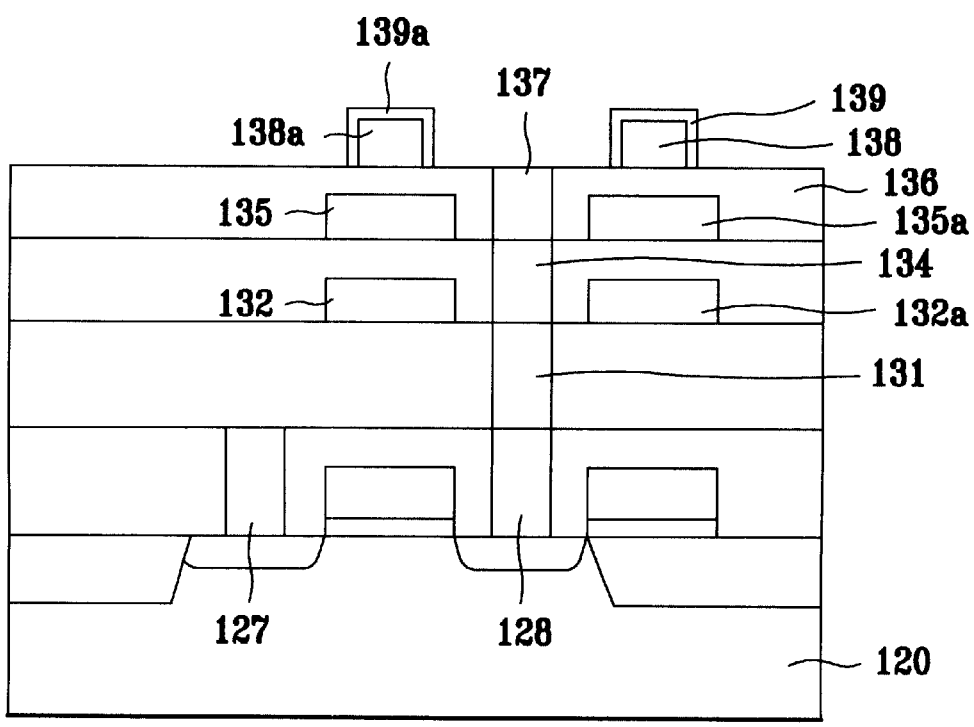

As shown in FIG. 12j illustrating a cross-section along a line I–I' in FIG. 11j, first and second ferroelectric films 139 and 139a are respectively formed to cover the first electrodes 138 and 138a of the first and second ferroelectric capacitors. That is, a ferroelectric material is deposited on an entire surface inclusive of the first electrodes 138 and 138a of the first and second ferroelectric capacitors, and etched to leave the ferroelectric material only at sides, and top surfaces of the first electrodes.

Figure 12K:
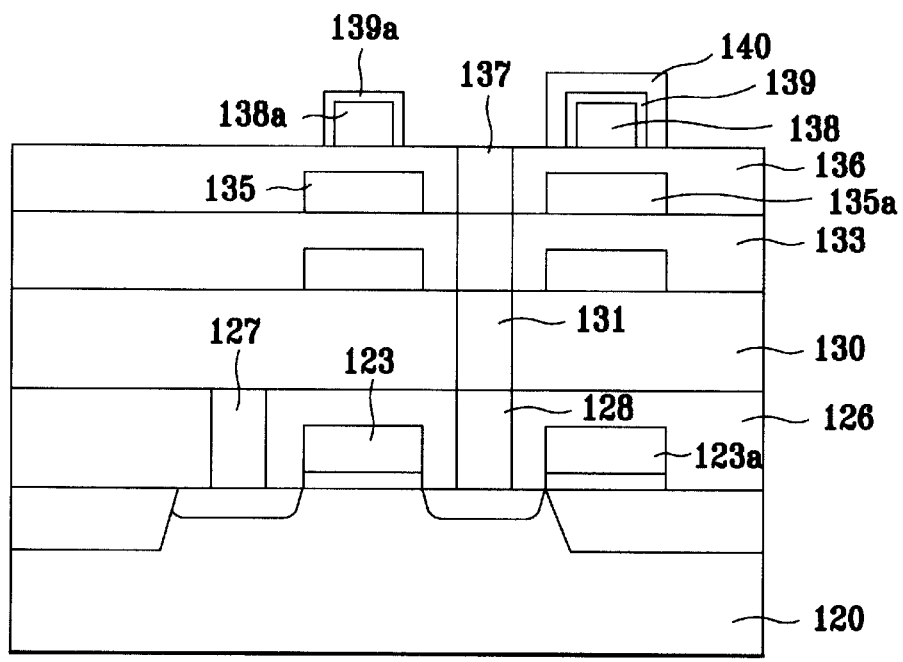

As shown in FIG. 12k illustrating a cross-section along a line I–I' in FIG. 11k, an electrode material is deposited on an entire surface of the substrate inclusive of the first and second ferroelectric films 139 and 139a for use as second electrodes of the ferroelectric capacitors, and the second electrode 140 of the first ferroelectric capacitor and the second electrode 140a (not shown) of the second ferroelectric capacitor are formed. Since FIG. 12k illustrates a cross-section along a line I–I' in FIG. 11k, the second electrode of the second ferroelectric capacitor is not shown.

Figure 12L:
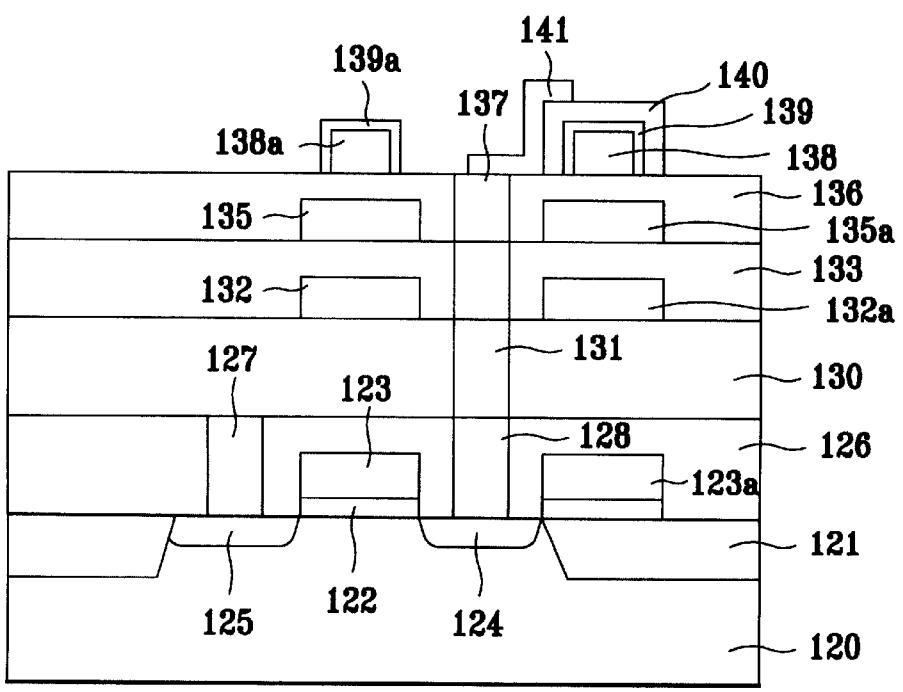

As shown in FIG. 12l illustrating a cross-section along a line I–I' in FIG. 11l, a first contact layer 141 is formed such that the second electrode 140 of the first ferroelectric capacitor and the fifth plug 137 are electrically coupled, and a second contact layer 141a (not shown) is formed such that the second electrode 140a of the second ferroelectric capacitor and the fifth plug 137a are electrically coupled. The first and second conductive layers 132 and 135 formed between the first split wordline 123 and the first electrode 138a of the second ferroelectric capacitor are preferably electrically coupled in the peripheral region, but not in the cell region. The first and second conductive layers 132a and 135a formed between the second split wordline 123 and the first electrode 138 of the first ferroelectric capacitor are preferably electrically coupled in a peripheral region, but not in the cell region. Therefore, the first split wordline 123 and the second split wordline 123a are preferably provided with a identical driving signal, together with the first conductive layers 132 and 132a, and the second conductive layers 135 and 135a.

As described above, preferred embodiments of nonvolatile ferroelectric memories and methods for fabricating the same according to the present invention have various advantages. Forming plural layers of shunt lines between the split wordline and the lower electrode of the ferroelectric capacitor and the electrical connection of the shunt lines and the lower electrode to the split wordline reduces or minimizes an RC delay on the split wordlines. Accordingly, an operational speed of the memory device can be increased. The planarization of insulating layers between the shunt lines, which permits shunt lines having small line widths, in formation of the shunt lines allow a small sized cell for the memory device. The formation of the ferroelectric layer to cover the first electrode of the capacitor increases or maximizes an electrode area, which secures a larger or maximum capacitance.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A ferroelectric memory having a plurality of unit cells, wherein each unit cell comprises:
   first and second bitlines extending in a first direction;
   first and second transistors;
   first and second ferroelectric capacitors;
   a first split wordline extending in a second direction to cross the first and second bitlines, wherein the first split wordline is coupled to a control electrode of the first transistor and a first electrode of the second ferroelectric capacitor;
   a second split wordline extending in the second direction to cross the first and second bitlines and coupled to a control electrode of the second transistor and a first electrode of the first ferroelectric capacitor;
   at least one first shunt line extending in the second direction and coupled to the first split wordline; and
   at least one second shunt line extending in the second direction and coupled to the second split wordline.

2. The ferroelectric memory device of claim 1, wherein the first and second shunt lines are respectively over the first and second split wordlines and insulated from the first and second split wordlines within the unit cell, and wherein the first and second shunt lines are provided in a first insulation layer over the first and second split wordlines.

3. The ferroelectric memory of claim 1, wherein a plurality of first shunt lines are disposed in a plurality of layers over the first split wordline and under the first electrode of the second ferroelectric capacitor in the unit cell, and a plurality of second shunt lines are disposed in the plurality of layers over the second split wordline and under the first electrode of the first ferroelectric capacitor.

4. The ferroelectric memory of claim 3, wherein the first electrode of the first ferroelectric capacitor is coupled to the second split wordline and the second shunt lines, and wherein the first electrode of the second ferroelectric capacitor is coupled to the first split wordline and the first shunt lines.

5. The ferroelectric memory of claim 1, wherein the second electrode of the first ferroelectric capacitor is coupled to a first electrode of the first transistor, and the second electrode of the second ferroelectric capacitor is coupled to a first electrode of the second transistor.

6. The ferroelectric memory of claim 5, wherein a plurality of plug layers couple the second electrode of the first ferroelectric capacitor and the first electrode of the first transistor, and couple the second electrode of the second ferroelectric capacitor and the first electrode of the second transistor.

7. The ferroelectric memory of claim 1, further comprising:
   a cell array block being first subset of the plurality of unit cells;
   a wordline driver that controls the split wordlines;
   at least one sense amplifier array coupled to the bitlines that respectively senses a data from a selected memory cell, wherein the first and second shunt lines are metal.

8. The ferroelectric memory of claim 7, wherein the metal includes Pt or tungsten, and wherein plural plug layers are a material including one of polysilicon and tungsten.

9. A ferroelectric memory, comprising:
   a first active region and a second active region defined in a semiconductor substrate;
   first and second split wordlines that respectively cross the active regions;
   first shunt lines in first and second insulating layers over the first split wordline;
   second shunt lines in the first and second insulating layers over the second split wordline;
   a first electrode of a second ferroelectric capacitor over the first shunt lines, wherein the first electrode of the second ferroelectric capacitor is coupled to the first split wordline and the first shunt lines; and
   a first electrode of a first ferroelectric capacitor over the second shunt lines, wherein the first electrode of the first ferroelectric capacitor is coupled to the second split wordline and the second shunt lines.

10. The ferroelectric memory of claim 9, wherein a ferroelectric layer and a second electrode of the first ferroelectric capacitor are successively provided on the first electrode of the first ferroelectric capacitor, and wherein the ferroelectric layer and a second electrode of the second ferroelectric capacitor are successively provided on the first electrode of the second ferroelectric capacitor.

11. The ferroelectric memory of claim 10, wherein the second electrode of the first ferroelectric capacitor is electrically coupled to a first active region at one side of the first split wordline, and the second electrode of the second ferroelectric capacitor is electrically coupled to a second active region at one side of the second split wordline.

12. The ferroelectric memory of claim 11, wherein the first active region coupled to the second electrode of the first ferroelectric capacitor is a first electrode of the first transistor, and the second active region coupled to the second electrode of the second ferroelectric capacitor is a first electrode of the second transistor.

13. The ferroelectric memory of claim 12, wherein a plurality of plug layers couple the second electrode of the first ferroelectric capacitor and the first electrode of the first transistor, and couple the second electrode of the second ferroelectric capacitor and the first electrode of the second transistor.

14. The ferroelectric memory of claim 13, wherein a first contact layer is between one end of the first plurality of plug layers and the second electrode of the first ferroelectric capacitor, and wherein a second contact layer is between one end of the second plurality of plug layers and the second electrode of the second ferroelectric capacitor.

15. The ferroelectric memory of claim 14, wherein the first and second contact layers are a material that includes titanium nitride, and wherein the first and second plurality of plug layers are a material that includes one of polysilicon and tungsten.

16. The ferroelectric memory of claim 9, wherein the first and second shunt lines are a material that includes one of Pt and tungsten.

17. The ferroelectric memory of claim 9, wherein the first shunt lines are over the first split wordline extending along in a first direction with the first split wordline, and the second shunt lines are over the second split wordline each extending in the first direction.

18. The ferroelectric memory of claim 9, wherein the first electrodes of the first and second ferroelectric capacitors are a material that includes Pt.

* * * * *